US010529777B2

(12) United States Patent
Sei et al.

(10) Patent No.: US 10,529,777 B2
(45) Date of Patent: Jan. 7, 2020

(54) SWITCH DEVICE AND STORAGE UNIT

(71) Applicant: SONY SEMICONDUCTOR SOLUTIONS CORPORATION, Kanagawa (JP)

(72) Inventors: Hiroaki Sei, Kanagawa (JP); Kazuhiro Ohba, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/559,601

(22) PCT Filed: Mar. 16, 2016

(86) PCT No.: PCT/JP2016/058390
§ 371 (c)(1),
(2) Date: Sep. 19, 2017

(87) PCT Pub. No.: WO2016/158430
PCT Pub. Date: Oct. 6, 2016

(65) Prior Publication Data
US 2018/0204881 A1 Jul. 19, 2018

(30) Foreign Application Priority Data
Mar. 31, 2015 (JP) .................. 2015-073054

(51) Int. Cl.
*H01L 45/00* (2006.01)
*H01L 27/24* (2006.01)
*G11C 13/00* (2006.01)

(52) U.S. Cl.
CPC ........ *H01L 27/2481* (2013.01); *G11C 13/003* (2013.01); *G11C 13/0004* (2013.01);
(Continued)

(58) Field of Classification Search
CPC ..... H01L 45/14; H01L 45/141; H01L 45/143; H01L 27/2472; H01L 27/249
See application file for complete search history.

(56) References Cited

U.S. PATENT DOCUMENTS

2009/0127538 A1* 5/2009 Ryoo .................. H01L 27/2409
257/5
2011/0260133 A1 10/2011 Sakamoto et al.
(Continued)

FOREIGN PATENT DOCUMENTS

JP 2006-086526 3/2006
JP 2009-130344 A 6/2009
(Continued)

OTHER PUBLICATIONS

International Search Report prepared by the Japan Patent Office dated Apr. 12, 2016, for International Application No. PCT/JP2016/058390.
(Continued)

*Primary Examiner* — Hoai V Pham
(74) *Attorney, Agent, or Firm* — Sheridan Ross P.C.

(57) ABSTRACT

A switch device according to an embodiment of the technology includes a first electrode, a second electrode that faces the first electrode, and a switch layer provided between the first electrode and the second electrode. The switch layer includes a chalcogen element. The switch device further includes a diffusion suppressing layer that is in contact with at least a portion of a surface of the switch layer, and suppresses diffusion of oxygen into the switch layer.

17 Claims, 19 Drawing Sheets

(52) U.S. Cl.
CPC ...... *G11C 13/0007* (2013.01); *G11C 13/0069* (2013.01); *H01L 27/2427* (2013.01); *H01L 45/04* (2013.01); *H01L 45/065* (2013.01); *H01L 45/12* (2013.01); *H01L 45/1233* (2013.01); *H01L 45/1253* (2013.01); *H01L 45/142* (2013.01); *H01L 45/143* (2013.01); *H01L 45/144* (2013.01); *G11C 2013/0073* (2013.01); *G11C 2213/15* (2013.01); *G11C 2213/51* (2013.01); *G11C 2213/71* (2013.01); *G11C 2213/76* (2013.01)

(56) References Cited

U.S. PATENT DOCUMENTS

| | | |
|---|---|---|
| 2012/0008369 A1 | 1/2012 | Shimuta et al. |
| 2013/0256622 A1 | 10/2013 | Sei et al. |
| 2013/0256624 A1 | 10/2013 | Kau |

FOREIGN PATENT DOCUMENTS

| | | |
|---|---|---|
| JP | 2010-157316 | 7/2010 |
| JP | 2012-018964 A | 1/2012 |
| JP | 2013-211411 A | 10/2013 |
| JP | 2014-530491 A | 11/2014 |
| WO | WO 2010/079829 A1 | 7/2010 |

OTHER PUBLICATIONS

Lee et al: "Varistor-type Bidirectional Switch (JMAX>107A/cm2, Selectivity~104) for 3D Bipolar Resistive Memory Arrays"; 2012 Symposium on VLSI Technology Digest of Technical Papers; Jun. 2012.

Huang et al: "One Selector-One Resistor (1S1R) Crossbar Array for High-density Flexible Memory Applications"; Electron Devices Meeting (IEDM), 2011 IEEE International.

Son et al: "Excellent Selector Characteristics of Nanoscale VO2 for High-Density Bipolar ReRAM Applications"; IEEE Electron Device Letters, vol. 32, No. 11, Nov. 2011.

Kim et al: "Ultrathin (<10nm) Nb2O5/NbO2 Hybrid Memory with Both Memory and Selector Characteristics for High Density 3D Vertically Stackable RRAM Applications"; 2012 Symposium on VLSI Technology Digest of Technical Papers.

* cited by examiner

FIG. 13

| SAMPLE | SPUTTERING APPARATUS | DEGREE OF VACUUM (Pa) |
|---|---|---|
| 01 | A | 3.0E-7 |
| 02 | B | 1.0E-6 |
| 03 | C | 8.0E-6 |
| 04 | D | 5.0E-5 |
| 05 | E | 2.5E-4 |

FIG. 14

| SAMPLE | OXYGEN CONTENT (at%) |
|---|---|
| 01 | 1.5 |
| 02 | 1.8 |
| 03 | 3.4 |
| 04 | 5.2 |
| 05 | 7.0 |

| SAMPLE | THRESHOLD VOLTAGE VARIATION |
|--------|-----------------------------|
| 06 | 0.088 |
| 07 | 0.41 |

FIG. 21

| SAMPLE | THRESHOLD VOLTAGE VARIATION |
|---|---|
| 08 | 0.091 |
| 09 | 1.4 |

SWITCH DEVICE AND STORAGE UNIT

CROSS REFERENCE TO RELATED APPLICATIONS

This application is a national stage application under 35 U.S.C. 371 and claims the benefit of PCT Application No. PCT/JP2016/058390 having an international filing date of 16 Mar. 2016, which designated the United States, which PCT application claimed the benefit of Japanese Patent Application No. 2015-073054 filed 31 Mar. 2015, the disclosures of which are incorporated herein by reference in their entirety.

TECHNICAL FIELD

The disclosure relates to a switch device including a chalcogenide layer between electrodes, and to a storage unit including the switch device.

BACKGROUND ART

In recent years, increase of a capacity is demanded for a data storage non-volatile memory that is represented by a resistance change memory such as a resistance random access memory (ReRAM) and phase-change random access memory (PRAM) (registered trademark). In the existing resistance change memory using an access transistor, however, floor area per unit cell is large. Therefore, the increase of the capacity is not easy even when miniaturization is performed under the same design rule, as compared with, for example, an NAND flash memory. In contrast, in a case where a so-called cross point array structure in which a memory device is disposed at a cross point (cross point) of intersecting wirings is used, the floor area per unit cell is decreased, which makes it possible to realize the increase of the capacity.

A selecting device (a switch device) for cell selection is provided in addition to the memory device in the cross point memory cell. Examples of the switch device include a switch device (for example, see NPTLs 1 and 2) that is configured using, for example, a PN diode, an avalanche diode, or a metal oxide, and a switch device (for example, see NPTLs 3 and 4) that is switched at a predetermined threshold voltage by Mott transition to drastically increase the current.

Examples of the switch device include a switch device (an ovonic threshold switch (OTS) device) using a chalcogenide material. The OTS device is disclosed in, for example, PTLs 1 and 2. The OTS device has characteristics in which a current is drastically increased at a switching threshold voltage or higher, which makes it possible to provide a relatively large current density in a selected (ON) state. In addition, a layer made of a chalcogenide material (an OTS layer) has an amorphous microstructure. This allows for formation of the OTS layer under a condition of room temperature of, for example, a physical vapor deposition (PVD) method or a chemical vapor deposition (CVD) method. Accordingly, the OTS device has an advantage of high process affinity with a manufacturing process of the memory device.

CITATION LIST

Patent Literature

PTL 1: Japanese Unexamined Patent Application Publication No. 2006-86526

PTL 2: Japanese Unexamined Patent Application Publication No. 2010-157316

Non-Patent Literature

NPTL 1: Jiun-Jia Huang et al., 2011 IEEE IEDM11-733 to 736

NPTL 2: Wootae Lee et al., 2012 IEEE VLSI Technology symposium pp. 37 to 38

NPTL 3: Myungwoo Son et al., IEEE ELECTRON DEVICE LETTERS, VOL. 32, No. 11, November 2011

NPTL 4: Seonghyun Kim et al., 2012 VLSI pp. 155 to 156

SUMMARY OF INVENTION

In the cross point memory cell array, increasing the number of cross points makes it possible to achieve increase of the capacity. In a case where threshold voltage variation in each OTS device is large, however, a voltage at which resistance change occurs in a memory cell that has a combination of the memory device and the switch device is largely varied, and a settable range of a read voltage (a read margin) between the high-resistance state and the low-resistance state of the memory cell becomes small. As a result, there has been an issue in which the number of cross points is not easily increased.

Therefore, it is desirable to provide a switch device that makes it possible to suppress variation of an operation threshold voltage in each OTS device, and a storage unit including the switch device.

A switch device according to a first embodiment of the disclosure includes: a first electrode; a second electrode that faces the first electrode; and a switch layer provided between the first electrode and the second electrode. The switch layer includes one or more kinds of chalcogen elements selected from tellurium (Te), selenium (Se), and sulfur (S). The switch device further includes a diffusion suppressing layer that is in contact with at least a portion of a surface of the switch layer, and suppresses diffusion of oxygen into the switch layer.

A storage unit according to a first embodiment of the disclosure includes a plurality of memory cells. Each of the memory cells includes a memory device and a switch device directly coupled to the memory device. The switch device included in each of the memory cells has a configuration that is the same as the configuration of the above-described switch device according to the first embodiment.

In the switch device according to the first embodiment of the disclosure and the storage unit according to the first embodiment of the disclosure, at least the portion of the surface of the switch layer is covered with the diffusion suppressing layer that suppresses the diffusion of the oxygen into the switch layer. This makes it possible to reduce an amount of oxygen entering the switch layer during a manufacturing process of the switch device or in use of the switch device. Here, in a case where the amount of oxygen contained in the switch layer is greater than a predetermined amount, variation of an operation threshold voltage of the switch device becomes large. In contrast, in a case where the amount of oxygen contained in the switch layer is equal to or less than the predetermined amount, the variation of the operation threshold voltage of the switch device becomes small. Therefore, at least the portion of the surface of the switch layer is covered with the diffusion suppressing layer that suppresses the diffusion of the oxygen into the switch layer, which can make the amount of oxygen contained in the switch layer less than the predetermined amount. This can suppress the variation of the operation threshold voltage of the switch device.

A switch device according to a second embodiment of the disclosure includes: a first electrode; a second electrode that faces the first electrode; and a switch layer provided between the first electrode and the second electrode. The switch layer includes one or more kinds of chalcogen elements selected from tellurium (Te), selenium (Se), and sulfur (S), and has an oxygen content that is 5% or less.

A storage unit according to a second embodiment of the disclosure includes a plurality of memory cells. Each of the memory cells includes a memory device and a switch device directly coupled to the memory device. The switch device included in each of the memory cells has a configuration that is the same as the configuration of the above-described switch device according to the second embodiment.

In the switch device according to the second embodiment of the disclosure and the storage unit according to the second embodiment of the disclosure, the oxygen content of the switch layer is 5% or less. Here, in a case where the amount of oxygen contained in the switch layer is greater than 5%, variation of an operation threshold voltage of the switch device becomes large. In contrast, in a case where the amount of oxygen contained in the switch layer is 5% or less, the variation of the operation threshold voltage of the switch device becomes small. Therefore, in the switch device according to the second embodiment of the disclosure, the variation of the operation threshold voltage of the switch device can become small.

The switch device according to the first embodiment of the disclosure, the storage unit according to the first embodiment of the disclosure, the switch device according to the second embodiment of the disclosure, and the storage unit according to the second embodiment of the disclosure each make it possible to make the variation of the operation threshold voltage of the switch device small.

BRIEF DESCRIPTION OF DRAWINGS

FIG. 13 is a diagram illustrating manufacturing conditions of five samples 01 to 05.

FIG. 14 is a diagram illustrating measurement values of respective oxygen contents of the five samples 01 to 05.

FIG. 21 is a diagram illustrating threshold voltage variation of the switch device in a sample with an oxide film around the switch device and in a sample without an oxide film around the switch device.

DESCRIPTION OF EMBODIMENTS

Some embodiments of the disclosure are described in detail below with reference to drawings. Note that description is given in the following order.

1. Embodiment

Figure 1:
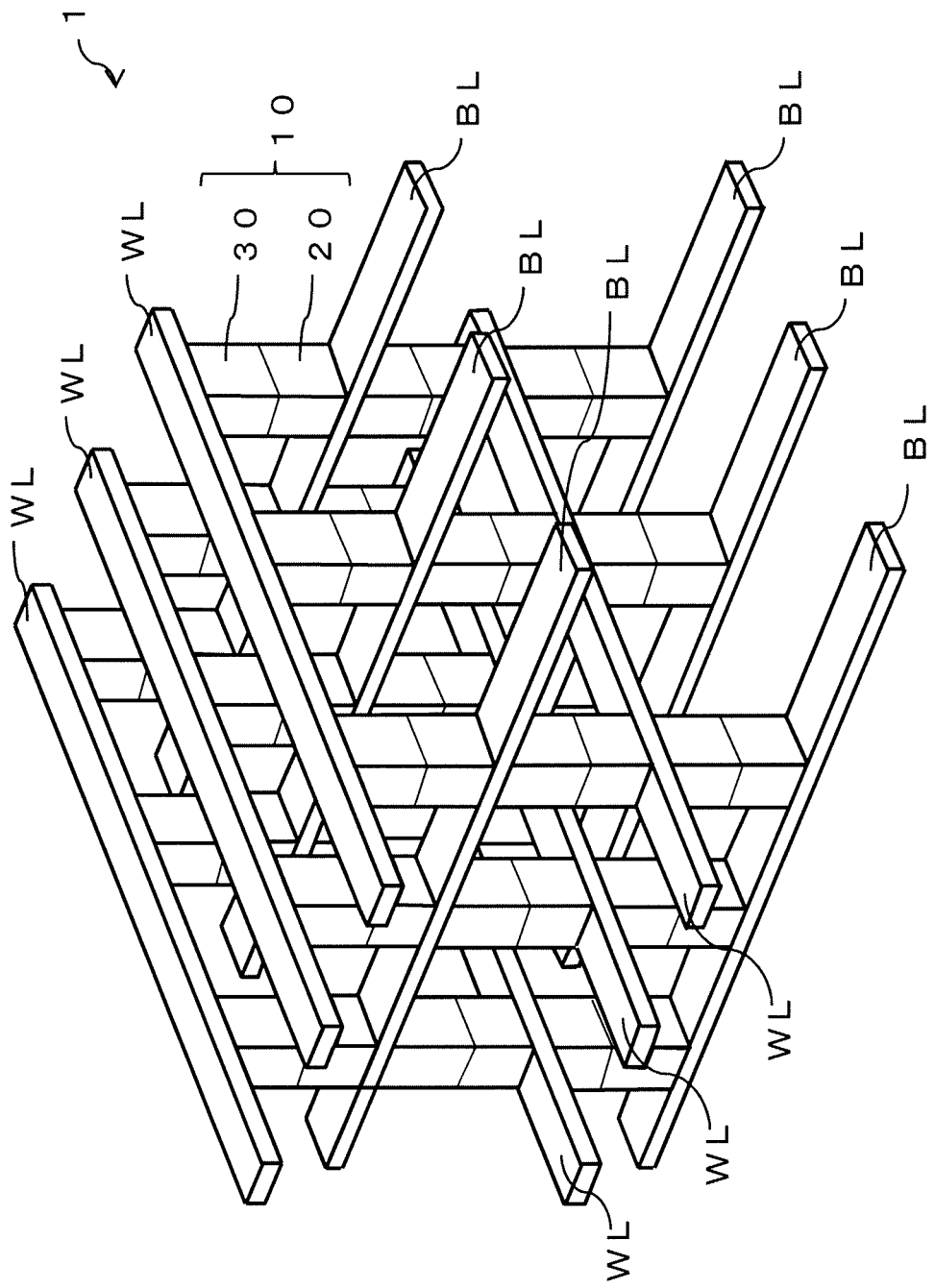
FIG. 1 is a diagram illustrating a schematic configuration of a memory cell array according to an embodiment of the disclosure.

An example in which a diffusion suppressing layer is provided around a switch device to reduce an oxygen content of a switch layer 2. Modifications Modification A: an example in which a switch device is provided along a bit line or a word line Modification B: an example in which a diffusion suppressing layer is omitted Modification C: an example in which a bit line or a word line extends in a stacking direction 1. Embodiment FIG. 1 is a diagram illustrating a perspective configuration of a memory cell array 1 according to an embodiment of the disclosure. The memory cell array 1 corresponds to a specific example of a "storage unit" of the disclosure. The memory cell array 1 has a so-called cross point array structure, and includes memory cells 10. For example, as illustrated in FIG. 1, each of the memory cells 10 is provided at a position (a cross point) where each of word lines WL and each of bit lines BL face each other. In other words, the memory cell array 1 includes the plurality of word lines WL, the plurality of bit lines BL, and the plurality of memory cells 10 that are disposed at the respective cross points one by one. As described above, the memory cell array 1 of the present embodiment has a three-dimensional structure in which the plurality of memory cells 10 are disposed in plane (two-dimensionally, in an XY plane direction), and are further stacked in a Z axis direction. This makes it possible to provide a storage unit with higher density and a large capacity. In addition, the memory cell array 1 of the present embodiment is able to have a vertical cross point structure in which one of the word lines WL and the bit lines BL are provided in parallel to the Z axis direction and the other remaining lines are provided in parallel to the XY plane.

The word lines WL extend in directions that are common to each other. The bit lines BL extend in directions that are different from the extending direction of the word lines WL (for example, in a direction orthogonal to the extending direction of the word lines WL), and that are common to each other. The plurality of word lines WL are disposed in one or a plurality of layers, and for example, as illustrated in FIG. 1, the plurality of word lines WL are disposed separately in a plurality of levels. The plurality of bit lines BL are disposed in one or a plurality of layers, and for example, as illustrated in FIG. 1, the plurality of bit lines BL are disposed separately in a plurality of levels.

In a case where the plurality of word lines WL are disposed separately in the plurality of levels, the plurality of bit lines BL are disposed in a layer between a first layer in which the plurality of word lines WL are disposed and a second layer in which the plurality of word lines WL are disposed. The second layer is adjacent to the first layer. In a case where the plurality of bit lines BL are disposed separately in the plurality of levels, the plurality of word lines WL are disposed in a layer between a third layer in which the plurality of bit lines BL are disposed and a fourth layer in which the plurality of bit lines BL are disposed. The fourth layer is adjacent to the third layer. In a case where the plurality of word lines WL are disposed separately in the plurality of levels and the plurality of bit lines BL are disposed separately in the plurality of levels, the plurality of word lines WL and the plurality of bit lines BL are alternately disposed in a stacking direction of the memory cell array 1.

The memory cell array 1 includes the plurality of memory cells 10 that are two-dimensionally or three-dimensionally arranged on a substrate. The substrate includes, for example, a wiring group that is electrically coupled to each of the word lines WL and each of the bit lines BL, a circuit that couples the wiring group to an external circuit, and so forth. Each of the memory cells 10 includes a memory device 30 and a switch device 20 that is directly coupled to the memory device 30. The switch device 20 corresponds to a specific example of a "switch device" of the disclosure. The memory device 30 corresponds to a specific example of a "memory device" of the disclosure.

For example, the memory device 30 is disposed close to the word line WL, and the switch device 20 is disposed close to the bit line BL, for example. Note that the memory device 30 may be disposed close to the bit line BL, and the switch device 20 may be disposed close to the word line WL. In addition, in a case where the memory device 30 is disposed close to the word line WL and the switch device 20 is disposed close to the bit line BL in a certain layer, the memory device 30 may be disposed close to the bit line BL and the switch device 20 may be disposed close to the word line WL in a layer adjacent to the certain layer. Moreover, in each layer, the memory device 30 may be disposed on the switch device 20, or inversely, the switch device 20 may be disposed on the memory device 30.

[Memory Device 30]

Figure 2A:
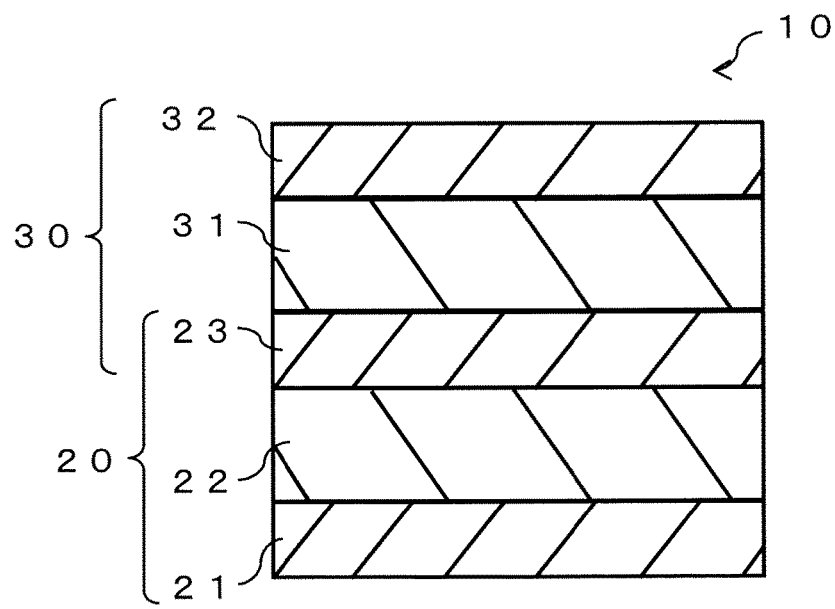
FIG. 2A is a diagram illustrating an example of a configuration of a memory cell of FIG. 1.
Figure 2B:
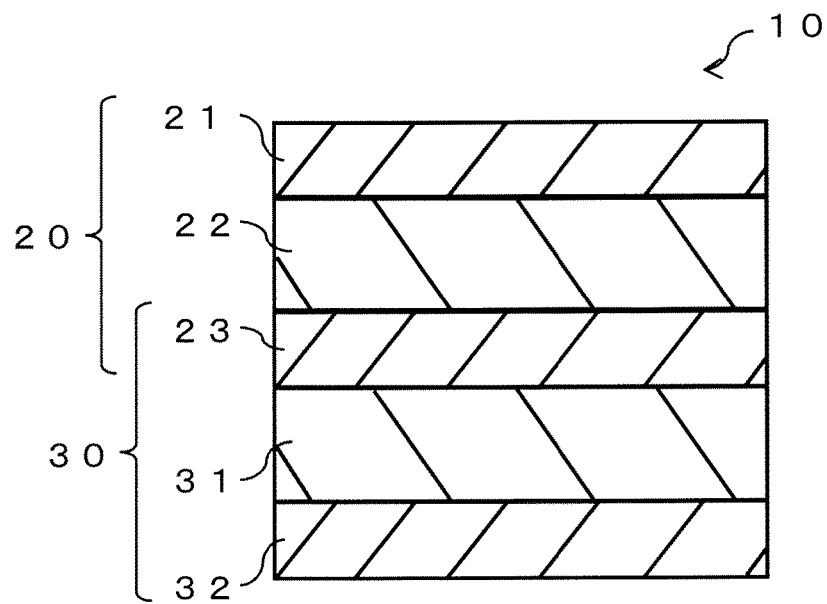
FIG. 2B is a diagram illustrating an example of the configuration of the memory cell of FIG. 1.

FIG. 2A and FIG. 2B each illustrate an example of a cross-sectional configuration of the memory cell 10 in the memory cell array 1. The memory device 30 includes an intermediate electrode 23, a second electrode 32, and a memory layer 31. The second electrode 32 faces the intermediate electrode 23. The memory layer 31 is provided between the intermediate electrode 23 and the second electrode 32. The memory layer 31 has, for example, a stacking structure in which a resistance change layer and an ion source layer are stacked from the intermediate electrode 23 side, or a single-layer structure of the resistance change layer.

The ion source layer contains movable elements that form a conduction path in the resistance change layer in response to application of an electric field. Examples of the movable elements include transition metal elements, aluminum (Al), copper (Cu), and chalcogen elements. Examples of the chalcogen elements include tellurium (Te), selenium (Se), and sulfur (S). Examples of the transition metal elements include elements of groups 4 to 6 in the periodic table such as titanium (Ti), zirconium (Zr), hafnium (Hf), vanadium (V), niobium (Nb), tantalum (Ta), chromium (Cr), molybdenum (Mo), and tungsten (W). The ion source layer contains one or two or more kinds of the above-described movable elements. In addition, the ion source layer may contain oxygen (O), nitrogen (N), elements other than the above-described movable elements (such as manganese (Mn), cobalt (Co), iron (Fe), nickel (Ni), and platinum (Pt)), silicon (Si), or other element.

The resistance change layer is made of, for example, an oxide of a metal element or a non-metal element, or a nitride of a metal element or a non-metal element. In a case where a predetermined voltage is applied between the intermediate electrode 23 and the second electrode 32, a resistance value of the resistance change layer is varied. For example, when the voltage is applied between the intermediate electrode 23 and the second electrode 32, the transition metal elements contained in the ion source layer move into the resistance change layer to form the conduction path, which decreases the resistance of the resistance change layer. In addition, a structure defect such as an oxygen defect and a nitrogen defect occurs in the resistance change layer to form the conduction path, which decreases the resistance of the resistance change layer. Further, when a voltage in a direction opposite to the direction of the voltage that is applied at the time when the resistance of the resistance change layer is decreased is applied, the conduction path is disconnected or electroconductivity is changed, to increase the resistance of the resistance change layer.

Note that the metal element and the non-metal element contained in the resistance change layer are not all necessarily in the oxide state, and may be partially oxidized. In addition, it is sufficient for an initial resistance value of the resistance change layer to achieve the device resistance of, for example, about several MΩ to about several hundred GΩ, and the film thickness of the resistance change layer may be preferably, for example, about 1 nm to about 10 nm although the optimal value thereof is varied depending on the size of the device and the resistance value of the ion source layer.

In addition, in the memory cell array 1 of the present embodiment, the memory device 30 is not limited to the above-described configuration. The memory device 30 may have any memory form such as a one time programmable (OTP) memory that uses a fuse and an anti-fuse and is writable only once, a unipolar phase change memory PCRAM, and a magnetic memory using a magnetoresistive device.

The intermediate electrode 23 may also serve as the electrode of the switch device 20, or may be provided separately from the electrode of the switch device 20. The second electrode 32 may also serve as the word line WL or the bit line BL, or may be provided separately from the word line WL and the bit line BL. In a case where the second electrode 32 is provided separately from the word line WL and the bit line BL, the second electrode 32 is electrically coupled to the word line WL or the bit line BL. The second electrode 32 is made of a wiring material used for a semiconductor process. The second electrode 32 includes, for example, tungsten (W), tungsten nitride (WN), titanium nitride (TiN), carbon (C), copper (Cu), aluminum (Al), molybdenum (Mo), tantalum (Ta), tantalum nitride (TaN), titanium tungsten (TiW), silicide, or the like.

The intermediate electrode 23 is preferably made of a material that prevents chalcogen elements contained in the switch layer 22 and the ion source layer from diffusing in response to the application of the electric field. This is because, for example, the ion source layer contains transition metal elements as elements that allow for memory operation and retaining of a writing state, and switch characteristics may possibly be deteriorated when such transition metal elements are diffused into the switch layer 22 in response to the application of the electric field. Accordingly, the intermediate electrode 23 preferably contains a barrier material having barrier property that prevents diffusion and ion conduction of the transition metal elements. Examples of the barrier material include tungsten (W), tungsten nitride (WN), titanium nitride (TiN), carbon (C), copper (Cu), aluminum (Al), molybdenum (Mo), tantalum (Ta), tantalum nitride (TaN), titanium tungsten (TiW), and silicide.

[Switch Device 20]

The switch device 20 includes a first electrode 21, the intermediate electrode 23, and a switch layer 22. The intermediate electrode 23 faces the first electrode 21. The switch layer 22 is provided between the first electrode 21 and the intermediate electrode 23. The first electrode 21 and the intermediate electrode 23 respectively correspond to specific examples of "first electrode" and "second electrode" of the disclosure. The first electrode 21 may also serve as the bit line BL, or may be provided separately from the bit line BL. In a case where the first electrode 21 is provided separately from the bit line BL, the first electrode 21 is electrically coupled to the bit line BL. Note that, in the case where the switch device 20 is provided close to the word line WL, the first electrode 21 may also serve as the word line WL, or may be provided separately from the word line WL. In a case where the first electrode 21 is provided separately from the word line WL, the first electrode 21 is electrically coupled to the word line WL.

The intermediate electrode 23 may also serve as the electrode of the memory device 30 or may be provided separately from the electrode of the memory device 30. In a case where the intermediate electrode 23 is provided separately from the electrode of the memory device 30, the intermediate electrode 23 is electrically coupled to the electrode of the memory device 30. The first electrode 21 is made of a wiring material used for a semiconductor process. The first electrode 21 includes, for example, tungsten (W), tungsten nitride (WN), titanium nitride (TiN), carbon (C), copper (Cu), aluminum (Al), molybdenum (Mo), tantalum (Ta), tantalum nitride (TaN), titanium tungsten (TiW), silicide, or the like. In a case where the first electrode 21 is made of a material in which ion conduction possibly occurs in response to the electric field, such as Cu, a surface of the first electrode 21 including, for example, Cu may be coated with a barrier material in which the ion conduction and heat dissipation are difficult to occur. Examples of the barrier material in which the ion conduction and heat dissipation are difficult to occur include tungsten (W), tungsten nitride (WN), titanium nitride (TiN), and tantalum nitride (TaN).

The switch layer 22 contains elements of group 16 in the periodic table, specifically, one or more kinds of chalcogen elements selected from tellurium (Te), selenium (Se), and sulfur (S). In the switch device 20 having OTS phenomenon, the switch layer 22 preferably stably maintains an amorphous structure even when receiving application of the voltage bias directed to the switching. It is possible to generate the OTS phenomenon stably as the amorphous structure becomes more stable. The switch layer 22 preferably further contains, in addition to the above-described chalcogen elements, one or more kinds of elements selected from boron (B), aluminum (Al), gallium (Ga), carbon (C), silicon (Si), germanium (Ge), nitrogen (N), phosphorus (P), arsenic (As), antimony (Ab), and bismuth (Bi). The switch layer 22 more preferably further contains, in addition to the above-described chalcogen elements, one or more kinds of elements selected from boron (B), carbon (C), silicon (Si), and nitrogen (N). The switch layer 22 preferably contains any one of compositions of BTe, CTe, BCTe, CSiTe, BSiTe, BCSiTe, BTeN, CTeN, BCTeN, CSiTeN, BSiTeN, and BCSiTeN.

When an element having a relatively small atomic radius is added to an element having a relatively large atomic radius, a difference between the atomic radii of the constituent elements becomes large, and the crystal structure is not easily formed accordingly, making it easier to stabilize the amorphous structure. Accordingly, in a case where an element having a relatively small atomic radius such as boron (B) is added into the layer containing the chalcogen element having a relatively large atomic radius such as Te as with the switch layer 22, a plurality of elements having different atomic radii are contained in the layer, which stabilizes the amorphous structure.

Boron (B) has low electroconductivity among semimetals even being used alone in particular. Therefore, boron (B) is contained in the switch layer 22, which increases a resistance value of the switch layer 22. In addition, boron (B) has a small atomic radius as compared with the chalcogen elements. Therefore, boron (B) is contained in the switch layer 22, which stabilizes the amorphous structure of the switch layer 22 and stably develops the OTS phenomenon.

Carbon (C) makes it possible to increase resistance of the switch layer 22 in the structure other than the structure including sp2 orbital that is observed in graphite, etc. In addition, carbon (C) has a small ionic radius as compared with the chalcogen elements, which stabilizes the amorphous structure of the switch layer 22 and stably develops the OTS phenomenon.

Nitrogen (N) is bonded with one of boron (B), carbon (C), and silicon (Si). Therefore, in the switch layer 22, nitrogen (N) and one of boron (B), carbon (C), and silicon (Si) in the switch layer 22 increases the resistance value of the switch layer 22. For example, a bandgap of a-BN that is the bond of nitrogen (N) and boron (B) is 5.05 even in the amorphous state. As described above, in the case where nitrogen (N) is contained in the switch layer 22, the resistance value of the switch layer 22 is larger than that in a case where nitrogen (N) is not contained in the switch layer 22, thereby reducing a leakage current. In addition, dispersing a bond substance of nitrogen (N) and one of boron (B), carbon (C), and silicon (Si) into the switch layer 22 stabilizes the amorphous structure.

The switch layer 22 is changed to a low-resistance state by increasing the application voltage to a predetermined threshold voltage (a switching threshold voltage) or higher, and is changed to a high-resistance state by decreasing the application voltage to a voltage lower than the above-described threshold voltage (the switching threshold voltage). In other words, the amorphous structure of the switch layer 22 is stably maintained irrespective of application of a voltage pulse or a current pulse from an unillustrated power supply circuit (a pulse applicator) through the first electrode 21 and the intermediate electrode 23. Moreover, the switch layer 22 does not perform memory operation such as retention of a conductive path formed by ion movement in response to the voltage application even after the application voltage is removed.

Figure 3:
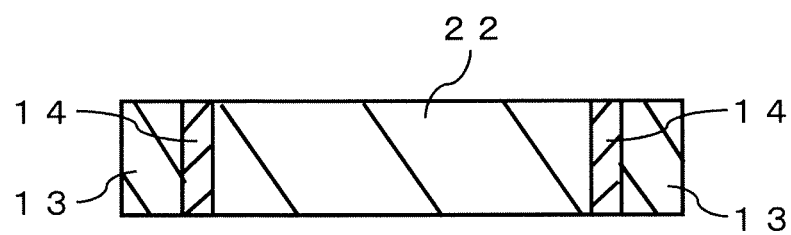
FIG. 3 is a diagram illustrating an example of a cross-sectional configuration of a portion of the switch device of FIG. 1 and a periphery thereof.

FIG. 3 illustrates an example of a cross-sectional configuration of the switch device 20 and a periphery thereof in the memory cell array 1. The memory cell 10 includes a diffusion suppressing layer 14 that is in contact with at least a side surface of the switch layer 22 as illustrated in FIG. 3, out of side surfaces of the switch device 20 and the memory device 30. The diffusion suppressing layer 14 is provided at a position that is different from a region between the switch layer 22 and the first electrode 21 and a region between the switch layer 22 and the intermediate electrode 23. The diffusion suppressing layer 14 includes a material that suppresses diffusion of oxygen into the switch layer 22. The diffusion suppressing layer 14 includes an insulating nitride, an insulating carbide, or an insulating boride. The diffusion suppressing layer 14 includes a single layer of one kind or stacked layers of two or more kinds selected from, for example, silicon nitride (SiN), tantalum nitride (TaN), silicon carbide (SiC), silicon carbonitride (SiCN), aluminum nitride (AlN), boron nitride (BN), and boron carbonitride (BCN). The diffusion suppressing layers 14, 23, and 24 cover the switch layer 22, and suppress diffusion of oxygen into the switch layer 22.

Figure 4A:
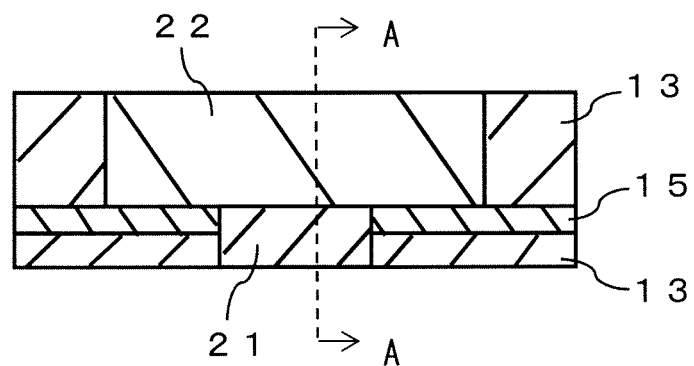
FIG. 4A is a diagram illustrating an example of a cross-sectional configuration of a portion of a switch device of FIG. 2A and a periphery thereof.
Figure 4B:
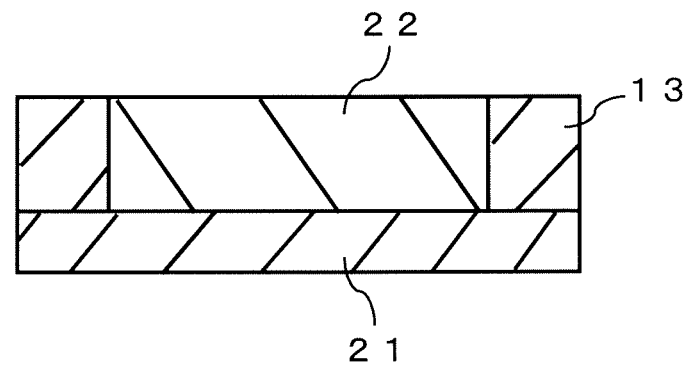
FIG. 4B is a diagram illustrating an example of the cross-sectional configuration along line A-A in FIG. 4A.
Figure 5A:
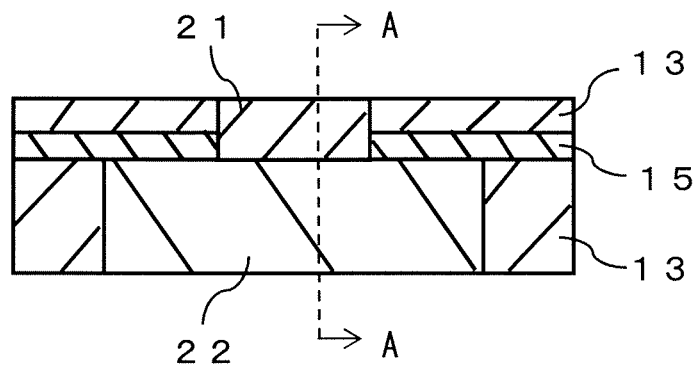
FIG. 5A is a diagram illustrating an example of a cross-sectional configuration of a portion of a switch device of FIG. 2B and a periphery thereof.
Figure 5B:
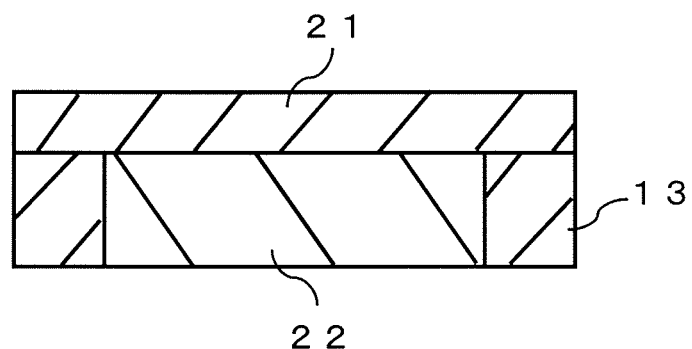
FIG. 5B is a diagram illustrating an example of the cross-sectional configuration along line A-A in FIG. 5A.

FIG. 4A and FIG. 4B each illustrate an example of a cross-sectional configuration of a portion of the switch device 20 of FIG. 2A and a periphery thereof. FIG. 5A and FIG. 5B each illustrate an example of a cross-sectional configuration of a portion of the switch device 20 of FIG. 2B and a periphery thereof. FIG. 4A and FIG. 5A each illustrate an example of a cross-section of the memory cell array 1 as viewed from a direction in which the bit lines BL or the word lines WL extend in a depth direction. FIG. 4B illustrates an example of the cross-section along line A-A in FIG. 4A. FIG. 5B illustrates an example of the cross-section along line A-A in FIG. 5A. In FIG. 4A, FIG. 4B, FIG. 5A, and FIG. 5B, it is assumed that the first electrode 21 also serves as the bit line BL or the word line WL, and the first electrode 21 has a small width so as to come into contact with only a portion of a top surface or a bottom surface of the switch layer 22. In this case, any portion of the top surface or the bottom surface of the switch layer 22 comes into contact with a member (such as an interlayer insulating film 13) different from the first electrode 21. At this time, oxygen may possibly be diffused into the switch layer 22 through the portion of the top surface or the bottom surface of the switch layer 22 which is in contact with the member different from the first electrode 21. Therefore, in a case where the area of a surface of the first electrode 21 coming into contact with the switch layer 22 is smaller than the area of a surface of the switch layer 22 coming into contact with the first electrode 21, each of the memory cells 10 preferably includes a diffusion suppressing layer 15. The diffusion suppressing layer 15 is so provided as to cover the portion that does not come into contact with the first electrode 21, of the surface of the switch layer 22 coming into contact with the first electrode 21. The diffusion suppressing layer 15 is in contact with the portion of the surface of the switch layer 22 which is not in contact with the first electrode 21, and is made of a material that suppresses the diffusion of oxygen into the switch layer 22. The diffusion suppressing layer 15 includes an insulating nitride or an insulating carbide. The diffusion suppressing layer 14 includes a single layer of one kind or stacked layers of two or more kinds selected from, for example, silicon nitride (SiN), tantalum nitride (TaN), silicon carbide (SiC), silicon carbonitride (SiCN), aluminum nitride (AlN), boron nitride (BN), and boron carbonitride (BCN).

In FIG. 4A and FIG. 5A, the interlayer insulating film 13 may be made of a material common to the material of the diffusion suppressing layer 15. Moreover, in a case where the area of a surface of the intermediate electrode 23 coming into contact with the switch layer 22 is smaller than the area of a surface of the switch layer 22 coming into contact with the intermediate electrode 23, each of the memory cells 10 preferably includes the diffusion suppressing layer 15. The diffusion suppressing layer 15 is so provided as to cover the portion that does not come into contact with the intermediate electrode 23, of the surface of the switch layer 22 coming into contact with the intermediate electrode 23. Here, the diffusion suppressing layer 15 is in contact with a portion of the surface of the switch layer 22 which is not in contact with the intermediate electrode 23.

Each of the first electrode 21 and the intermediate electrode 23 is preferably made of a metallic material that suppresses the diffusion of oxygen into the switch layer 22. Specifically, each of the first electrode 21 and the intermediate electrode 23 preferably includes a single-layer film of one kind, or an alloy-layer film or a stacked-layer film of two or more kinds selected from titanium (Ti), titanium nitride (TiN), tantalum (Ta), zirconium (Zr), zirconium nitride (ZrN), hafnium (Hf), hafnium nitride (HfN), tantalum oxide (TaN), tungsten (W), tungsten nitride (WN), platinum (Pt), gold (Au), ruthenium (Ru), and iridium (Ir).

Figure 6:
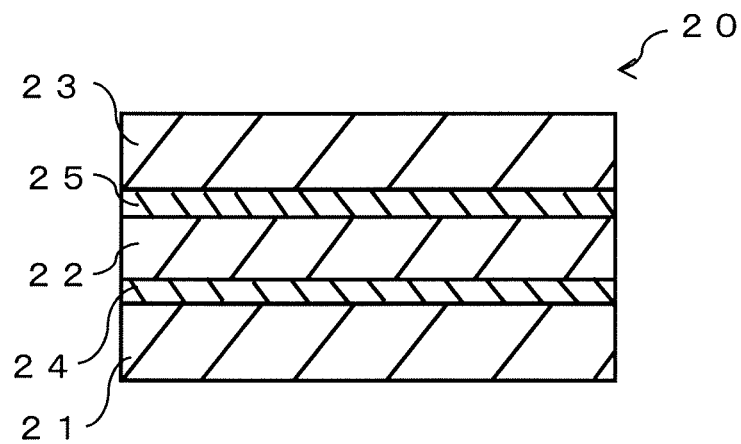
FIG. 6 is a diagram illustrating a modification of the cross-sectional configuration of the switch device of FIG. 1.

FIG. 6 illustrates a modification of the cross-sectional configuration of the switch device 20. The switch device 20 further includes diffusion suppressing layers 24 and 25 that sandwich the switch layer 22. The diffusion suppressing layer 24 is provided between the first electrode 21 and the switch layer 22, and is in contact with a surface of the switch layer 22. The diffusion suppressing layer 25 is provided between the intermediate electrode 23 and the switch layer 22, and is in contact with a surface of the switch layer 22. Each of the diffusion suppressing layers 24 and 25 is made of a material that suppresses the diffusion of oxygen into the switch layer 22. Each of the diffusion suppressing layers 24 and 25 includes a single-layer film of one kind, or an alloy-layer film or a stacked-layer film of two or more kinds selected from, for example, titanium (Ti), titanium nitride (TiN), tantalum (Ta), zirconium (Zr), zirconium nitride (ZrN), hafnium (Hf), hafnium nitride (HfN), tantalum nitride (TaN), tungsten (W), tungsten nitride (WN), platinum (Pt), gold (Au), ruthenium (Ru), and iridium (Ir). In a case where the diffusion suppressing layers 24 and 25 are different in material configuration from each other, the diffusion suppressing layers 24 and 25 may be different in thickness from each other. In a case where the first electrode 21 and the intermediate electrode 23 are made of a material different from the material of the diffusion suppressing layers 24 and 25, the diffusion suppressing layers 24 and 25 is preferably made of a material that has a high effect of suppressing the diffusion of oxygen into the switch layer as compared with the material of the first electrode 21 and the intermediate electrode 23. The first electrode 21 and the intermediate electrode 23 may be made of a material common to the material of the diffusion suppressing layers 24 and 25. In this case, the diffusion suppressing layer 24 configures a portion of the first electrode 21, and the diffusion suppressing layer 25 configures a portion of the intermediate electrode 23.

In a case where the first electrode 21 and the intermediate electrode 23 are made of an electrode material different from the material of the diffusion suppressing layers 24 and 25, the film thickness of each of the diffusion suppressing layers 24 and 25 is desirably within a range from 0.1 nm to 500 nm in terms of oxygen diffusion suppressing effect and process. In a case where each of the diffusion suppressing layers 24 and 25 is made of a material that is relatively high in resistance, such as hafnium nitride (HfN), zirconium nitride (ZrN), and tantalum nitride (TaN), the film thickness of each of the diffusion suppressing layers 24 and 25 is preferably adjusted such that the diffusion suppressing layers 24 and 25 become thin in a range from about 0.1 nm to about 10 nm, for example.

The diffusion suppressing layers 24 and 25 each may be an insulating film such as a film of silicon nitride (SiN). In this case, preferably, the diffusion suppressing layers 24 and 25 are each thin enough so as not to affect the switch characteristics of the switch device 20. The diffusion suppressing layers 24 and 25 are preferably silicon nitride (SiN) films each having a film thickness of, for example, 0.1 nm to 5 nm.

Figure 7A:
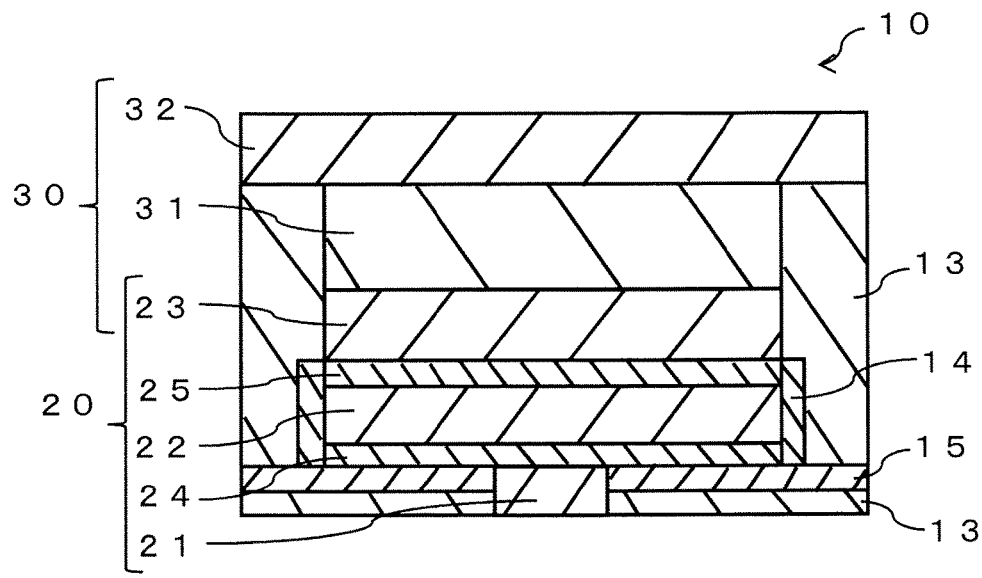
FIG. 7A is a diagram illustrating a modification of a cross-sectional configuration of a portion of the memory cell array of FIG. 1.
Figure 7B:
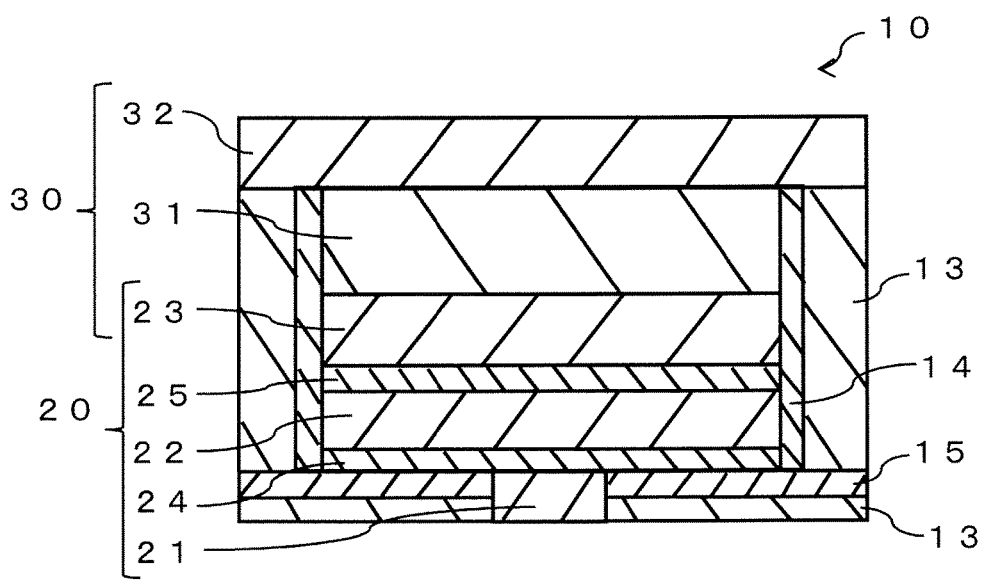
FIG. 7B is a diagram illustrating a modification of the cross-sectional configuration of the portion of the memory cell array of FIG. 1.
Figure 7C:
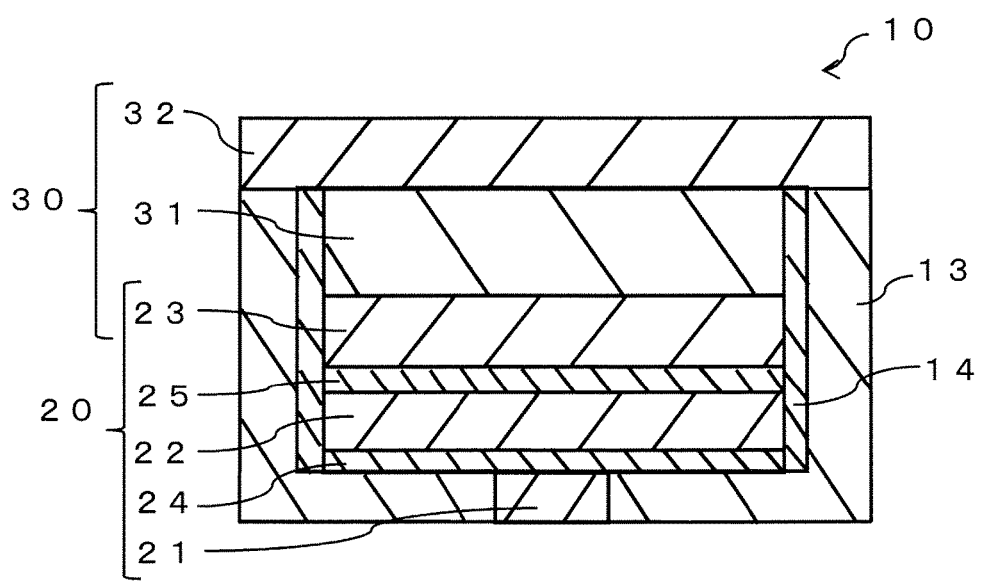
FIG. 7C is a diagram illustrating a modification of the cross-sectional configuration of the portion of the memory cell array of FIG. 1.

FIG. 7A, FIG. 7B, and FIG. 7C each illustrate a modification of the cross-sectional configuration of a portion of the memory cell array 1, and illustrate an example in which the above-described configurations are combined. FIG. 7A illustrates an example of the cross-sectional configuration of the memory cell 10 including the switch device 20 that has the configuration of FIG. 4A and a periphery thereof. FIG. 7B illustrates an example of the cross-sectional configuration of the memory cell 10 and the periphery thereof when the diffusion suppressing layer 14 covers up to a side wall of the memory device 30. FIG. 7C illustrates an example of the cross-sectional configuration of the memory cell 10 and the periphery thereof when the diffusion suppressing layer 15 is removed from the memory cell array 1 of FIG. 7B. As with those examples, the diffusion suppressing layer 14 is disposed between the switch layer 22 and the interlayer insulating film 13, which suppresses the diffusion of oxygen from the interlayer insulating film 13 into the switch layer 22. In particular, in a case where the interlayer insulating film 13 includes an oxide such as SiOx, disposing the diffusion suppressing layer 14 between the switch layer 22 and the interlayer insulating film 13 suppresses the diffusion of oxygen from the interlayer insulating film 13 into the switch layer 22. Note that, in terms of the suppression of the diffusion of oxygen into the switch layer 22, the switch layer 22 is preferably in contact with only a layer that is not an oxide, as illustrated in FIG. 7A and FIG. 7B.

[IV Characteristics of Memory Cell 10]

Next, IV characteristics of the memory cell 10 are described. FIG. 8 to FIG. 11 each illustrate a relationship between an application voltage and a value of a current flowing through the electrode at writing (for example, forward bias) and at erasing (for example, reverse bias) of the memory cell 10. A solid line indicates IV characteristics when a voltage is applied, and a dashed line indicates IV characteristics when the application voltage is swept in a decreasing direction.

Figure 8:
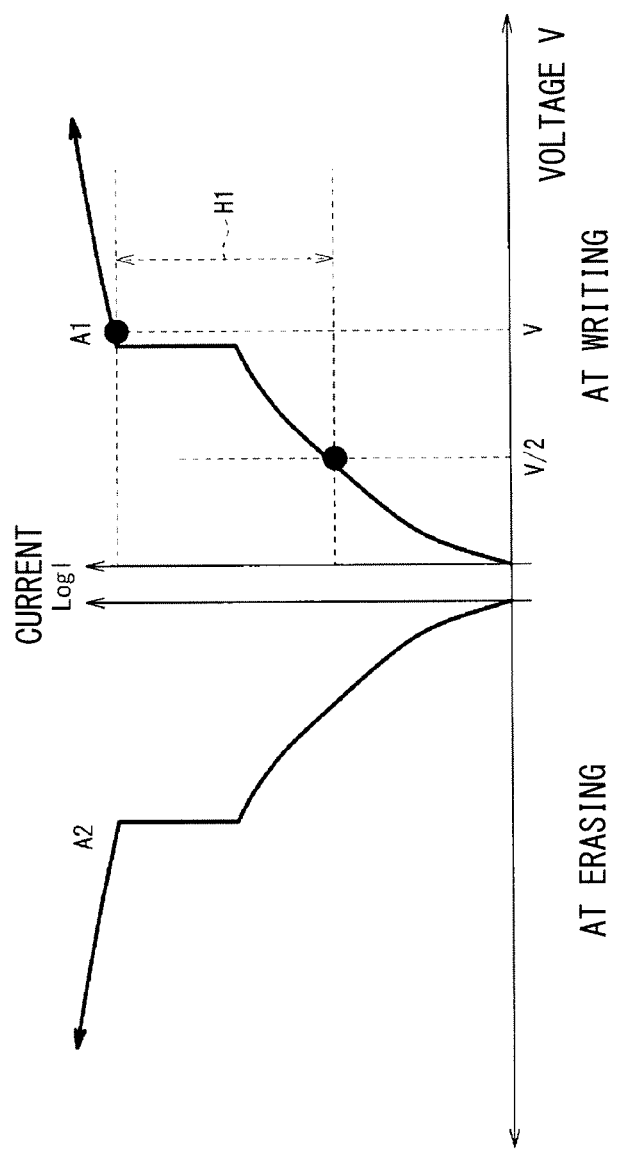
FIG. 8 is a diagram illustrating an example of IV characteristics of the switch device of FIG. 1.

FIG. 8 illustrates IV characteristics of the switch device 20. When the forward bias (in this case, a writing voltage) is applied to the switch device 20, the current is increased in the switch device 20 along with the increase of the application voltage. When the current exceeds a predetermined threshold voltage (a switching threshold voltage), the current is drastically increased or the resistance is decreased by the OTS operation, thereby putting the switch device 20 into an ON state. Thereafter, when the application voltage is decreased, the value of the current flowing through the electrode of the switch device 20 is gradually decreased. For example, the resistance is drastically increased at the threshold voltage that is substantially equivalent to the threshold voltage in increasing, and the switch device 20 is accordingly put into an OFF state, depending on the material and the formation condition of the switch device 20. Note that "H1" in FIG. 8 denotes a selection ratio of the switch device 20.

Figure 9:
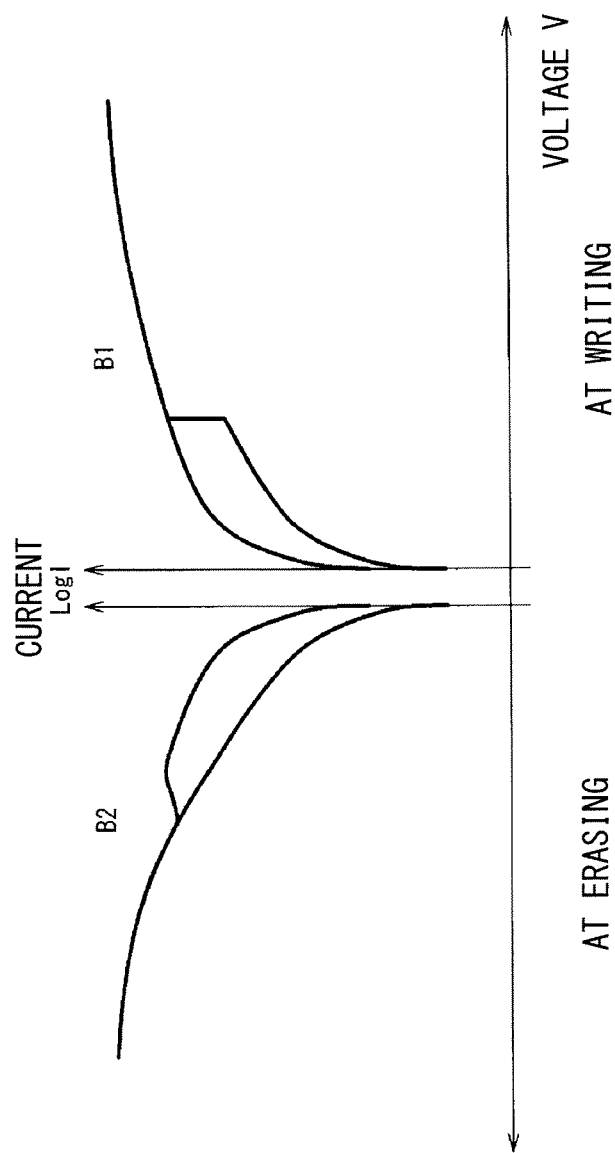
FIG. 9 is a diagram illustrating an example of IV characteristics of a memory device of FIG. 1.

FIG. 9 illustrates IV characteristics of the memory device 30. As can be appreciated from FIG. 9, the value of the current is increased in the memory device 30 along with the increase of the application voltage. The writing operation is performed, at a predetermined threshold voltage, through formation of the conductive path in the resistance change layer of the memory layer 31, thus changing the memory layer 31 to the low-resistance state and increasing the current. In other words, the memory device 30 is changed to the low-resistance state in response to the application of the writing voltage, and the low-resistance state is maintained even after the voltage application is stopped.

Figure 10:
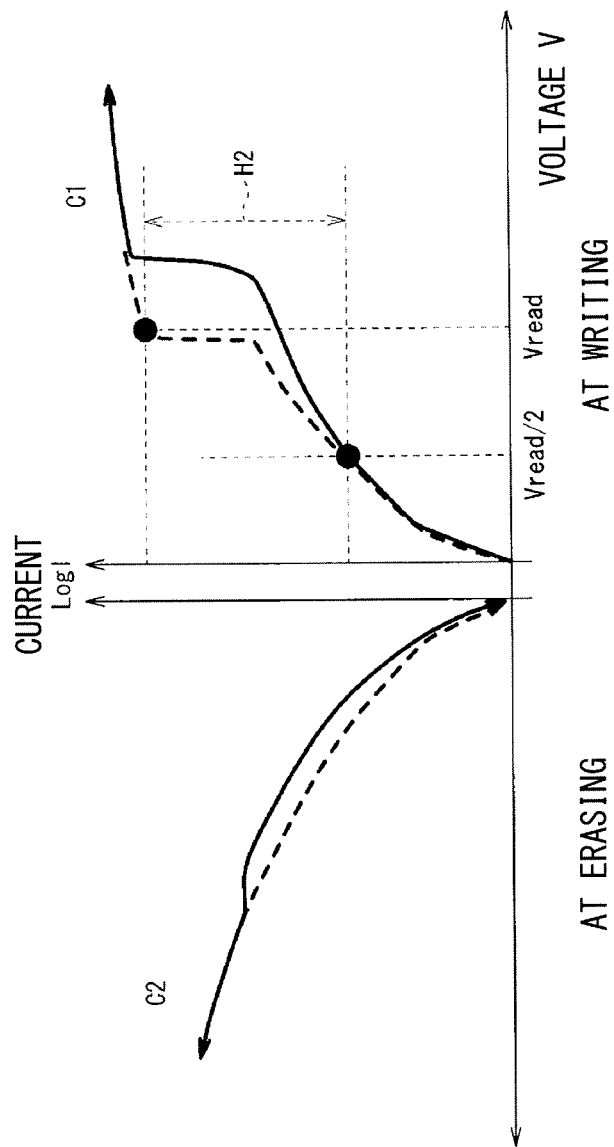
FIG. 10 is a diagram illustrating an example of IV characteristics of the memory cell of FIG. 1.

FIG. 10 illustrates the IV characteristics of the memory cell 10. A switching behavior of the current value of the memory cell 10 at application start and application stop of the writing voltage becomes an IV curve C1 in FIG. 10, which is a combination of an IV curve A1 of the switch device 20 and an IV curve B1 of the memory device 30. In such a memory cell 10, for example, in a V/2 bias system, the reading voltage (Vread) of the memory cell 10 is set to a voltage between voltages at two points at which resistance is steeply changed, on the IV curve C1 (a range of an arrow A in FIG. 10), and Vread/2 is set to a voltage half of the reading voltage Vread. This makes a selection ratio that is defined by a current ratio of the Vread bias and Vread/2 bias (an ON/OFF ratio) larger. In addition, since the IV curve C1 of the memory cell 10 is a combination of the IV curve A1 of the switch device 20 and the IV curve B1 of the memory device 30 as described above, the selection ratio (the ON/OFF ratio) becomes larger as the resistance variation (or the current variation) before and after the threshold of the switch device 20 is larger. In addition, the read margin becomes larger as the election ratio is larger, making it possible to increase the cross point array size without erroneous reading and to further increase the capacity of the memory cell array 1.

Figure 11:
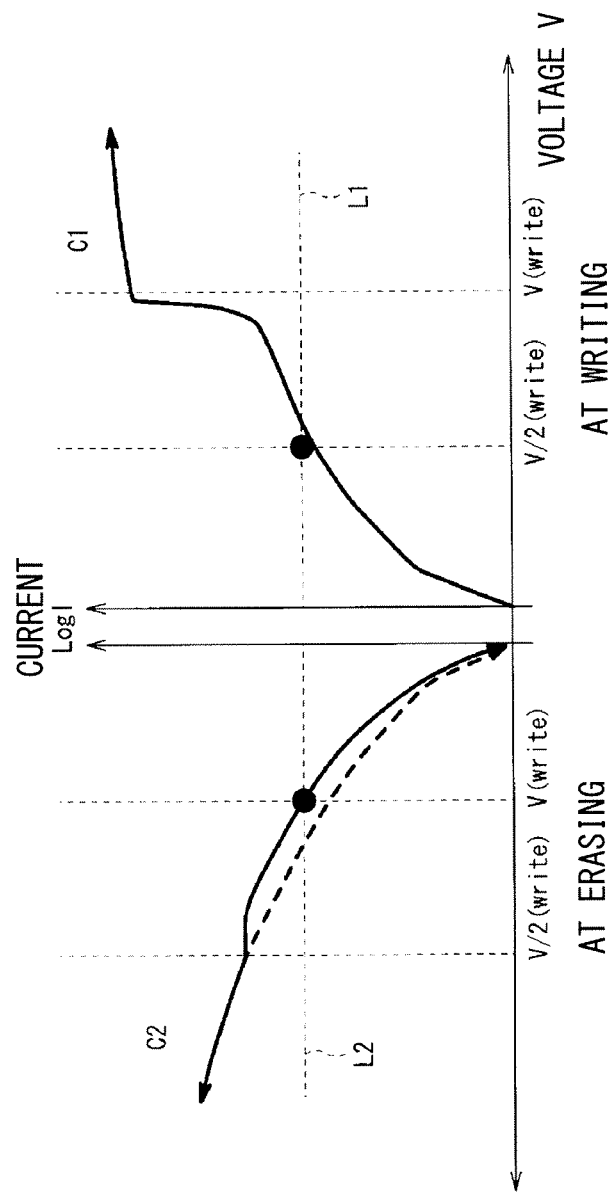
FIG. 11 is a diagram illustrating an example of the IV characteristics of the memory cell of FIG. 1.

This applies not only to the reading operation but also to the writing operation. FIG. 11 illustrates the IV characteristics of the memory cell 10 similarly to FIG. 10. As described above, in the cross point array, a large number of bits are coupled to the bit line BL or the word line WL that is the same as that of the target memory cell 10. Therefore, as illustrated in FIG. 11, erroneous writing may possibly occur in the non-selected memory cell 10 if a leakage current biased to Vwrite/2 in the non-selected state, which is denoted by a cross point of Vwrite/2 and an IV loop of the dashed line of the IV curve C1 in a Set state, is large. Therefore, in the writing operation, it is preferable that the leakage current be suppressed to the extent that does not cause the erroneous writing of the non-selected memory cell 10 biased to Vwrite/2, while the writing voltage Vwrite is set to the voltage that provides the current necessary for writing of the memory device 30. In other words, it is possible to operate the large-sized cross point array without involving the erroneous writing, as the leakage current biased to Vwrite/2 in the non-selected state is smaller. Accordingly, increasing the ON/OFF ratio of the switch device 20 also during the writing operation leads to a large capacity of the memory cell array 1.

On the other hand, when the reverse bias (in this case, the erasing voltage) is applied, the variation of the current value of the switch device 20 during application of the erasing voltage exhibits a behavior similar to that during the application of the writing voltage (an IV curve A2 of FIG. 8). In contrast, the current value of the memory device 30 during the application of the erasing voltage is varied from the low-resistance state to the high-resistance state by the application of the voltage equal to or higher than the erasing threshold voltage (an IV curve B2 of FIG. 9). Further, the variation of the current value of the memory cell 10 during the application of the erasing voltage becomes a combination of the IV curve A2 of the switch device 20 and the IV curve B2 of the memory device 30, as with the variation of the current value during the application of the writing voltage (an IV curve C2 of FIG. 10 or FIG. 11).

Note that, in the V/2 bias system, the leakage current at the erasing with Vreset/2 bias becomes an issue even in the case where the reading bias is set to the writing side, for example. In other words, in the case where the leakage current is large, unintentional erroneous erasing may possibly occur. Therefore, as with the case of applying the positive bias, the increase in the size of the cross point array is achieved more advantageously as the ON/OFF ratio of the switch device 20 becomes higher and as the leakage current in the OFF state becomes smaller. In other words, this leads to a large capacity of the memory cell array 1.

Figure 12:
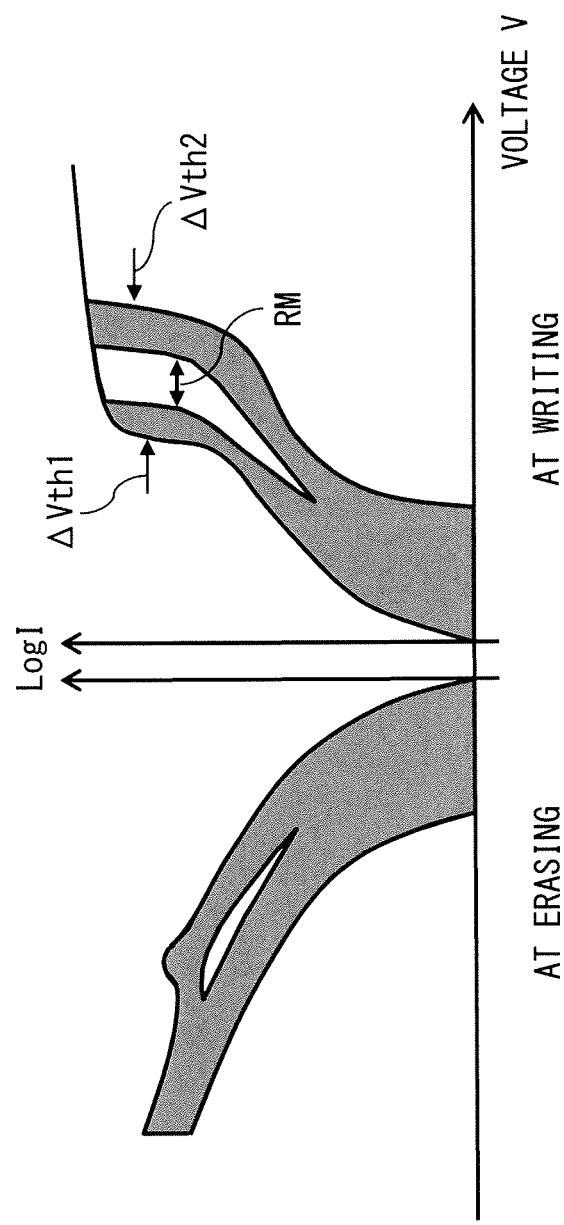
FIG. 12 is a diagram illustrating, in an overlapping manner, an example of IV characteristics of the respective memory cells of FIG. 1.

Incidentally, as can be appreciated from FIG. 8 to FIG. 11, the switch device 20, the memory device 30, and the memory cell 10 each have the IV curve similar to that upon the application of the writing voltage even when the erasing voltage is applied. In other words, the switch device 20, the memory device 30, and the memory cell 10 each have bidirectional characteristics. The IV characteristics of each of the switch device 20, the memory device 30, and the memory cell 10, in fact, involve variation for each device. Therefore, the plurality of (for example, 120) memory cells 10 included in the memory cell array 1 have threshold voltage variation as schematically illustrated in FIG. 12, for example. Note that a black-colored region in FIG. 12 denotes that the IV curve for each device involves the variation.

In the IV characteristics at the writing of FIG. 12, an IV curve on the right side is the IV curve of the memory cell 10 when the switch device 20 is in the OFF state. Therefore, variation of the IV curve on the right side indicates the threshold voltage variation of the memory device 30. In addition, in the IV characteristics at the writing of FIG. 12, an IV curve on the left side is the IV curve of the memory cell 10 when the memory device 30 is in the ON state. Therefore, variation of the IV curve on the left side indicates the threshold voltage variation of the switch device 20. In the IV characteristics at the writing of FIG. 12, a gap between the IV curve on the right side and the IV curve on the left side corresponds to a read margin RM. The increase in the size of the cross point array is achieved more advantageously as the read margin RM becomes larger. In other words, this leads to the large capacity of the memory cell array 1.

[Threshold Voltage Variation of Switch Device 20]

Next, various experiments that were performed to verify the threshold voltage variation of the switch device 20 are described.

Experiment 1

In Experiment 1, five samples (samples 01 to 05) were fabricated. A large number of switch devices 20 were formed on a surface of each of the samples. Each of the samples was formed in the following manner. First, a plurality of MOS transistor circuits and a plurality of first electrodes 21 including TiN were formed on a substrate while being exposed. The surface of the substrate was cleaned through reverse sputtering. Next, a Te target and a B4C target were concurrently sputtered while causing nitrogen to flow into a chamber, to form a BCTeN layer with a thickness of 20 nm on the first electrodes 21 including TiN. Subsequently, a W layer with a thickness of 30 nm was formed on a surface of the BCTeN layer. Thereafter, patterning was performed to form, on the substrate, the large number of switch devices 20 in which the first electrode 21 including TiN, the switch layer 22 configured by BCTeN layer, and the intermediate electrode 23 configured by the W layer were stacked. Heat treatment was carried out on the samples thus fabricated, at 320° C. for two hours. In Experiment 1, the degree of vacuum in the chamber was changed for each sample as illustrated in FIG. 13. Note that a sputtering apparatus was changed for each sample in order to change the degree of vacuum in the chamber.

An XPS analysis was carried out on each of the samples fabricated in the above-described manner, to derive compositions of the respective elements of the switch device 20 in each of the samples. As a result, it was confirmed that proportions of respective elements other than oxygen were the same among the samples. The oxygen contents of the switch devices 20 in the respective samples were illustrated in FIG. 14. It was found from FIG. 14 that the oxygen content of the switch device 20 becomes larger as the degree of vacuum in the chamber is larger.

Figure 15:
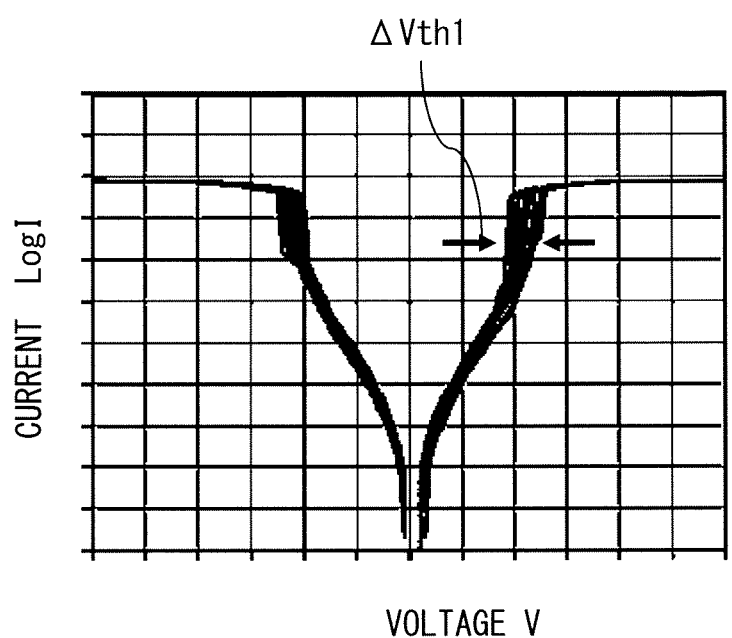
FIG. 15 is a diagram illustrating, in an overlapping manner, the IV characteristics of all of 120 switch devices formed in each of the samples 01 to 05.

Next, a gate voltage of the transistor provided in each of the samples was adjusted for each sample such that the maximum current with respect to the 120 switch devices 20 became 80 mA, and a source-drain voltage was increased by 0.1 V from 0 V to 6 V to measure the voltage at which the resistance was steeply changed. FIG. 15 illustrates measurement results obtained from the 120 switch devices 20 provided in the sample 05. It was confirmed from FIG. 16 that the similar IV curve is obtained irrespective of whether the voltage applied to the switch device 20 is a plus voltage or a minus voltage, and the switch device 20 has the bidirectional characteristics. In addition, it was found that the threshold voltages of the 120 switch devices 20 have variation ΔVth1 irrespective of whether the voltage applied to the switch device 20 is the plus voltage or the minus voltage.

Figure 16:
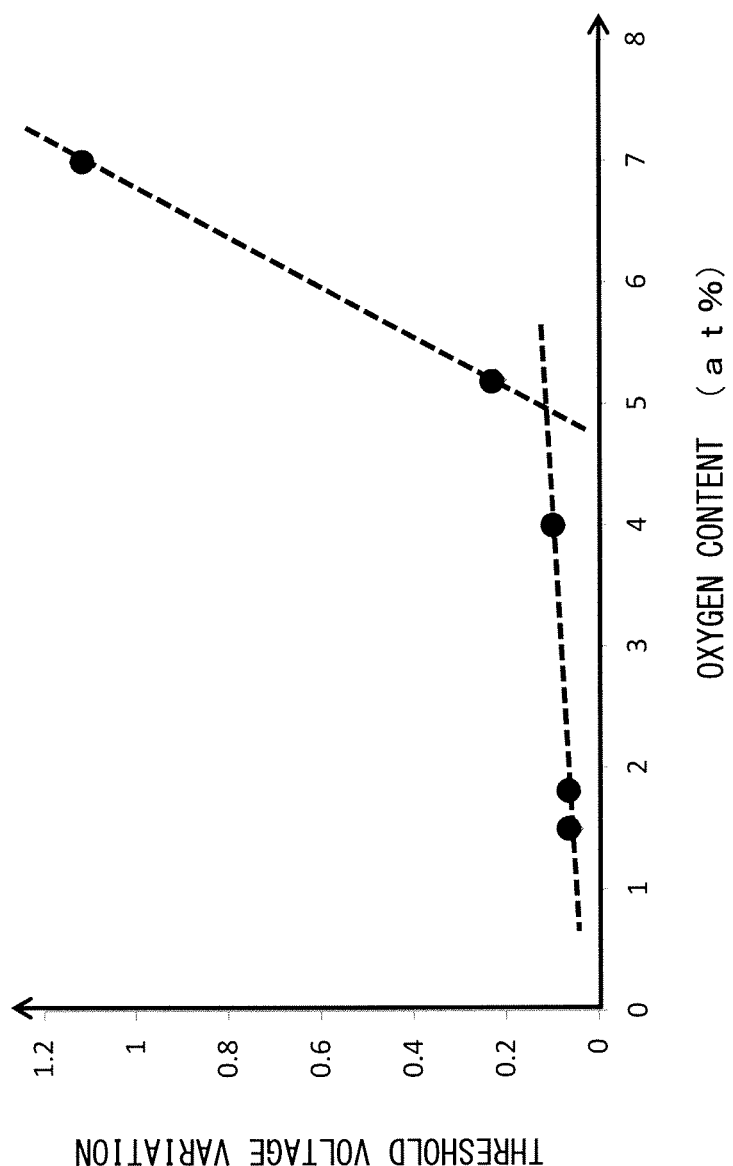
FIG. 16 is a diagram illustrating threshold voltage variation of the switch device in each of the samples 01 to 05.

Next, standard deviation of the threshold voltage variation of the 120 switch devices 20 obtained for each sample was determined. FIG. 16 illustrates the determined standard deviation plotted for each sample in a graph in which a horizontal axis indicates the oxygen content and a vertical axis indicates the standard deviation of the threshold voltage variation. It was found from FIG. 16 that the threshold voltage variation becomes larger as the oxygen content is larger. In other words, it was found that the oxygen content of the switch device 20 is increased as the degree of vacuum in the chamber before film formation is lower, and the threshold voltage variation is accordingly deteriorated. In particular, it can be appreciated that the threshold voltage variation is steeply deteriorated at the oxygen content of 5% as a boundary. In a certain film formation apparatus, film formation is performed at the degree of vacuum in the chamber at around 1.0E-5 Pa; however, when the film formation is started at around that degree of vacuum, the oxygen content exceeds 5% and the threshold voltage variation is largely deteriorated accordingly. Therefore, to further reduce the oxygen content and to suppress the threshold voltage variation, the film formation is preferably performed while the degree of vacuum in the chamber before the film formation is set to 1.0E-6 Pa or to a more favorable state. This suppresses the oxygen content of the switch layer 22 to 5% or less, thereby suppressing the threshold voltage variation of the switch device 20 to be low. In addition, sufficient performing of pre-sputtering of a target to be used, electric discharging of a getter material that absorbs oxygen, sufficient performing of baking of the chamber, and so forth may be contemplated as method to be performed to reduce the oxygen content before the film formation.

Although not necessarily clear, the presence of oxygen even in a small amount in the chalcogenide material such as BCTeN presumably causes bonding of oxygen with Te or any other element and partial segregation of bonded element, which presumably starts to cause the threshold voltage variation. When the oxygen content exceeds 5%, a rate of bonding of Te—O and a rate of bonding of any other element and oxygen are also increased presumably to cause large segregation in a wide region in the chalcogenide material, which presumably results in the drastic increase in the threshold voltage variation. In fact, it can be appreciate that the segregation occurs throughout the BCTeN layer, according to the TEM photograph of the BCTeN layer illustrated in FIG. 17 in which the oxygen content is 7%. Accordingly, it can be assumed that the switch device characteristics such as the threshold voltage become more stable and the threshold voltage variation is more reduced as the oxygen content is smaller.

The switch device characteristics are obtained from the OTS characteristics of the chalcogen element (Te). Therefore, the switch device characteristics are obtainable not only by a combination of one of B, C and N with any other element but also by a combination of the chalcogen element with any other element. Accordingly, it can be understood that the threshold voltage variation becomes larger as the amount of oxygen with respect to the chalcogen element (Te) is increased. Examples of the element configuring the switch device material include elements of group 13 (B, Al, and Ga), group 14 (C, Si, and Ge), and group 15 (N, P, As, Sb, and Bi). Using such elements prevent the resistance from being largely decreased. Further, performing adjustment of the composition of the element in combination with the chalcogen element makes it possible to obtain the switch device characteristics that allows for non-retaining of a resistance value. Examples of the switch device material that achieves such switch device characteristics include GaTeN, GeTeN, and AsGeSiNTe. In addition, a transition metal element such as Ti, Zr, and Hf and/or other metal element such as Mg and Gd may be added to the chalcogen element to the extent that the switch device characteristics are not impaired. Examples of such a switch device material include MgBTeN. Reducing the oxygen contained in the switch device material that has a combination of these elements and the chalcogen element as much as possible makes it possible to make the threshold voltage variation small.

[Experiment 2]

In Experiment 2, two samples (samples 06 and 07) were fabricated. A large number of switch devices 20 were formed on a surface of each of the samples. Each of the samples was fabricated in the following manner. The sample 06 is first described. A plurality of MOS transistor circuits and a plurality of first electrodes 21 including TiN were formed on a substrate while being exposed. The surface of the substrate was cleaned through reverse sputtering. Thereafter, a SiNx layer was formed through sputtering on the first electrodes 21 including TiN. Thereafter, the sample 06 was taken out from a chamber to the atmosphere once, and the sample 06 was then put in a photolithography process step to form a contact hole on the SiNx layer. Thereafter, the surface of the sample 06 was cleaned through reverse sputtering, and a TiN layer with a thickness of 10 nm was then formed in the contact hole. Subsequently, a BCTeN layer with a thickness of 20 nm was formed on a surface of the TiN layer and a W layer with a thickness of 30 nm was further formed on a surface of the BCTeN layer, through sputtering while causing nitrogen to flow into the chamber. A composition of the BCTeN layer at this time was the same as the composition of the BCTeN layer in Experiment 1. Thereafter, patterning was performed to form, on the substrate, the large number of switch devices 20 in which the first electrode 21 including TiN, the switch layer 22 configured of BCTeN layer, and the intermediate electrode 23 configured of the W layer were stacked. The sample 06 having the structure in which BCTeN that is sandwiched between the first electrode 21 including TiN and the intermediate electrode 23 configured of the W layer and in which the periphery thereof was covered with SiNx was fabricated in the above-described manner. Heat treatment was carried out on the sample 06 at 320° C. for two hours. Note that a SiOx layer was formed in place of the SiNx layer in the above-described process to fabricate the sample 07.

Figures 17, 18:
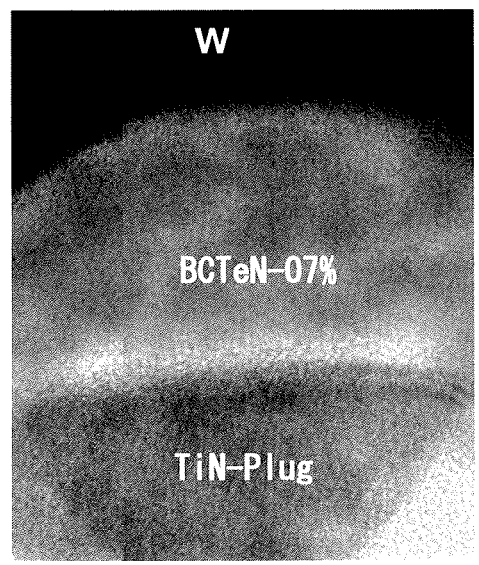
FIG. 17 is a TEM photograph of the switch device in the sample 05.
FIG. 18 is a diagram illustrating threshold voltage variation of the switch device when a periphery of the switch device is covered with a SiO2 film or a SiN film.

Next, the gate voltage of the transistor provided in each of the samples was adjusted for each sample such that the maximum current with respect to the 120 switch devices 20 become 80 mA, and the source-drain voltage was increased by 0.1 V from 0 V to 6 V to measure the voltage at which the resistance was steeply changed. Next, standard deviation of the threshold voltage variation of the 120 switch devices 20 obtained for each sample was determined. FIG. 18 illustrates the determined standard deviation for each sample. It was found from FIG. 18 that the threshold voltage variation of the switch device 20 is decreased in the case where the switch device 20 is surrounded by the SiNx layer, whereas the threshold voltage variation of the switch device 20 is increased in the case where the switch device 20 is surrounded by the SiOx layer.

In the case where oxygen is contained in the layer that comes into contact with the switch device 20 in the formation of the switch device material, oxygen is presumably diffused into the switch device material due to high temperature or heat treatment during the film formation or the process to increase the oxygen content. According to Experiment 1 the threshold voltage variation becomes lower than 0.1 in the case where the oxygen content in the switch device material BCTeN is 5% or less. In contrast, in the case where the SiNx layer is used as the interlayer film in Experiment 2, it is assumed that the oxygen content of the switch device material is 5% or less at any location. However, in the case where the SiOx layer is used as the interlayer film in Experiment 2, oxygen is diffused from the interlayer film into the switch device 20, which increases the oxygen content of the surface of the switch device material coming into contact with SiOx layer or the oxygen content of the switch device material as a whole to 5% or greater. This presumably results in easier occurrence of segregation due to bonding of oxygen with Te or any other element and occurrence of the threshold voltage variation.

Experiment 3

In Experiment 3, two samples (samples 08 and 09) were fabricated. A large number of switch devices 20 were formed on a surface of each of the samples. Each of the samples were fabricated in the following manner. The sample 08 is first described. A plurality of MOS transistor circuits and a plurality of first electrodes 21 including TiN were formed on a substrate while being exposed. The surface of the substrate was cleaned through reverse sputtering. Thereafter, a BCTeN layer was formed on the first electrode 21 including TiN and a W layer was formed on a surface of the BCTeN layer while causing nitrogen to flow into the chamber. Thereafter, patterning was performed to form, on the substrate, the large number of switch devices 20 in which the first electrode 21 including TiN, the switch layer 22 configured of BCTeN layer, and the intermediate electrode 23 configured of the W layer were stacked. Finally, each of the switch devices 20 as a whole was covered with a SiN layer. The process was performed in such a manner that the switch layer was not in contact with air and oxygen at all in these process steps. Heat treatment was performed on the sample 08 thus fabricated, at 320° C. for two hours. Note that, the sample 09 was fabricated by covering each of the switch devices 20 as a whole with the SiNx layer after the large number of switch devices 20 formed on the substrate had undergone the process step that uses oxygen such as atmospheric exposure and ashing in the above-described process.

Figure 19:
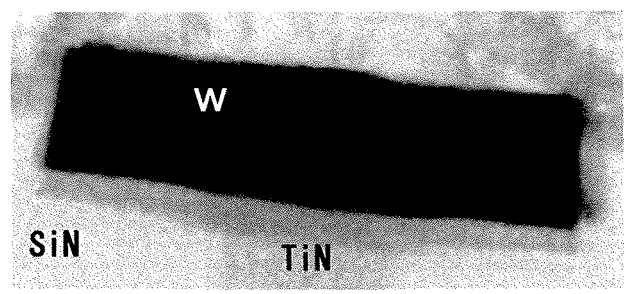
FIG. 19 is a TEM photograph of a switch device without an oxide film around the switch device.
Figure 20:
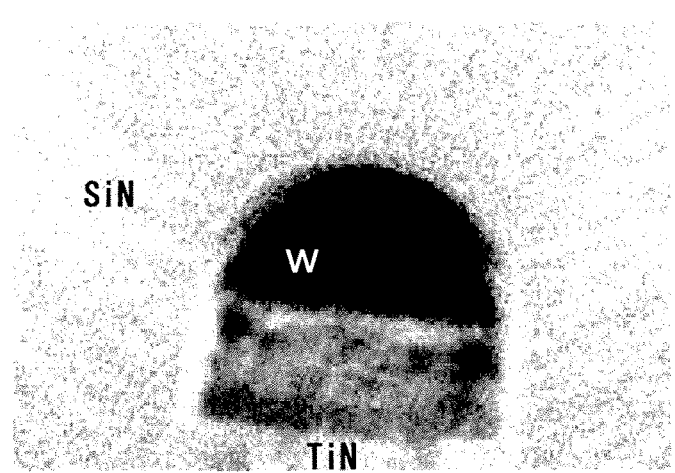
FIG. 20 is a TEM photograph of a switch device with an oxide film around the switch device.

FIG. 19 illustrates a TEM photograph of the sample 08. FIG. 20 illustrates a TEM photograph of the sample 09. FIG. 21 illustrates the threshold voltage variation of the switch devices 20 of the respective samples. It was found that an oxide film was not formed around the switch device 20 in FIG. 19 but an oxide film was formed around the switch device 20 in FIG. 20. The oxide film is an oxide of Si and the element contained in the switch device 20. This means that the oxide is generated between the switch layer 22 and the interlayer insulating film 13 due to exposure of the switch device 20 to oxygen through atmospheric exposure or to oxygen in ashing step for registry movement in the middle of the process, even when SiNx is used for the interlayer insulating film 13. It was found from FIG. 21 that the threshold voltage variation of the switch device 20 of the sample 08 is extremely smaller than the threshold voltage variation of the switch device 20 of the sample 09. Accordingly, the threshold voltage variation of the switch device 20 is presumably deteriorated largely irrespective of whether the oxide film is intentionally formed as with Experiment 2 or is unintentionally formed through the process as with Experiment 3, in a case where the oxide film is present around the switch layer 22 consequently and is in contact with the switch layer 22. Therefore, fabricating the device structure in which the periphery of the switch device 20 is in contact with only a layer that is not an oxide film makes it possible to make the threshold voltage variation small.

Next, effects of the memory cell array 1 according to the present embodiment are described.

As a result of Experiment 2, in the case where the oxide is used for the layer that comes into contact with the switch device 20, the oxygen content of the switch device 20 is increased and the threshold voltage variation of the switch device 20 is accordingly increased. Therefore, in a case of forming the insulating layer that covers the memory cell 10, using a nitride layer such as SiNx for the insulating layer in place of the oxide layer such as SiOx makes it possible to suppress the oxygen content of the switch device 20 to 5% or less, and to suppress the increase of the threshold voltage variation of the switch device 20. In addition, in a case where the interlayer insulating film 13 contains a large amount of oxide or oxygen, providing the diffusion suppressing layer 14 on the side surface of the switch device 20 to prevent the interlayer insulating film 13 from coming into direct contact with the side surface of the switch device 20 makes it possible to suppress the oxygen content of the switch device 20 to 5% or less, and to suppress the increase of the threshold voltage variation of the switch device 20.

In a case where, for example, the switch layer 22 is used in combination with RRAM in which oxygen is used in the memory device 30 or in combination with a PCM memory material in which oxygen is added, there may be a possible increase in the oxygen content of the switch layer 22 due to diffusion of oxygen from electrodes above and below the switch layer 22 (the first electrode 21 and the intermediate electrode 23). In addition, since the interlayer insulating film 13 is used in the memory cell array 1, there may similarly be a possible diffusion of oxygen in directions above and below. Even in such a case, however, when at least the electrodes above and below the switch layer 22 (the first electrode 21 and the intermediate electrode 23) are each made of the metallic material that suppresses the diffusion of oxygen into the switch layer 22 in the present embodiment, it is possible to suppress the diffusion of oxygen into the switch layer 22. As a result, it is possible to allow the oxygen content of the switch device 20 to be 5% or less, and to suppress the increase of the threshold voltage variation of the switch device 20. In addition, it is also possible to suppress the diffusion of oxygen into the switch layer 22 in a case where the diffusion suppressing layers 24 and 25 are respectively provided between the switch layer 22 and the first electrode 21 and between the switch layer 22 and the intermediate electrode 23 in the present embodiment. This makes it possible to allow the oxygen content of the switch device 20 to be 5% or less, and to suppress the increase of the threshold voltage variation of the switch device 20.

Further, in a case of the structure in which the first electrode 21 and the second electrode 32 are embedded in the interlayer insulating film 13, a portion of the top surface or the bottom surface of the switch layer 22 may sometimes not be covered with the first electrode 21 when the switch layer 22 comes into direct contact with the first electrode 21. In particular, when a line width of the first electrode 21 is small, a portion of the top surface or the bottom surface of the switch layer 22 may sometimes not be covered with the first electrode 21. Even in such a case, it is possible to suppress the diffusion of oxygen into the switch layer 22 in a case where the diffusion suppressing layer 15 is so provided between the switch layer 22 and the interlayer insulating film 13 as to prevent the switch layer 22 from coming into direct contact with the interlayer insulating film 13 in the present embodiment. This consequently makes it is possible to allow the oxygen content of the switch device 20 to be 5% or less, and to suppress the increase of the threshold voltage variation of the switch device 20.

2. Modifications

Some modifications of the memory cell array 1 according to the above-described embodiment are described below. Note that, in the following, components common to those of the above-described embodiment are denoted with the reference numerals that are the same as those denoted in the above-described embodiment. In addition, components different from those of the above-described embodiment are mainly described, and any description of the components common to those of the above-described embodiment is omitted where appropriate.

[Modification A]

Figure 22:
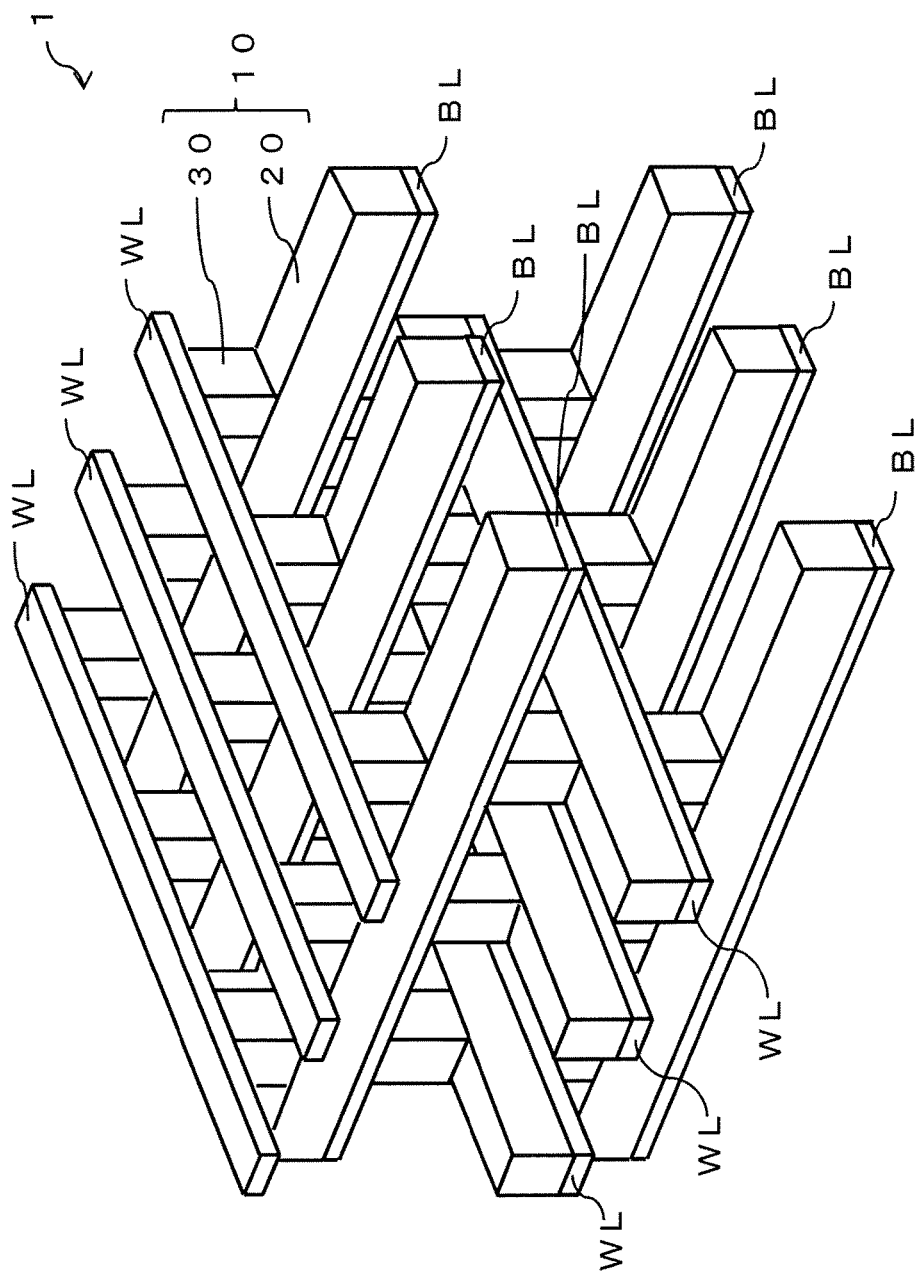
FIG. 22 is a diagram illustrating a modification of the perspective configuration of the memory cell array of FIG. 1.

FIG. 22 illustrates a modification of the memory cell array 1 according to the above-described embodiment. In the present modification, the switch device 20 is provided in contact with the bit line BL, and provided not only at the cross point but also in the extending direction of the bit line BL in an extending fashion, in the memory cell array 1. As a result, it is possible to form the switch device layer or the memory device layer concurrently with a layer that eventually becomes the bit line BL or the word line WL and to collectively perform shaping through photolithography, which allows for reduction of the process steps. In the present modification, layers that are in direct contact with the switch layer 22 (for example, the first electrode 21, the intermediate electrode 23, and the interlayer insulating film 13 therearound) are each made of a material that suppresses the diffusion of oxygen into the switch layer 22. This makes it possible to allow the oxygen content of the switch device 20 to be 5% or less, and to suppress the increase of the threshold voltage variation of the switch device 20.

[Modification B]

Figure 23:
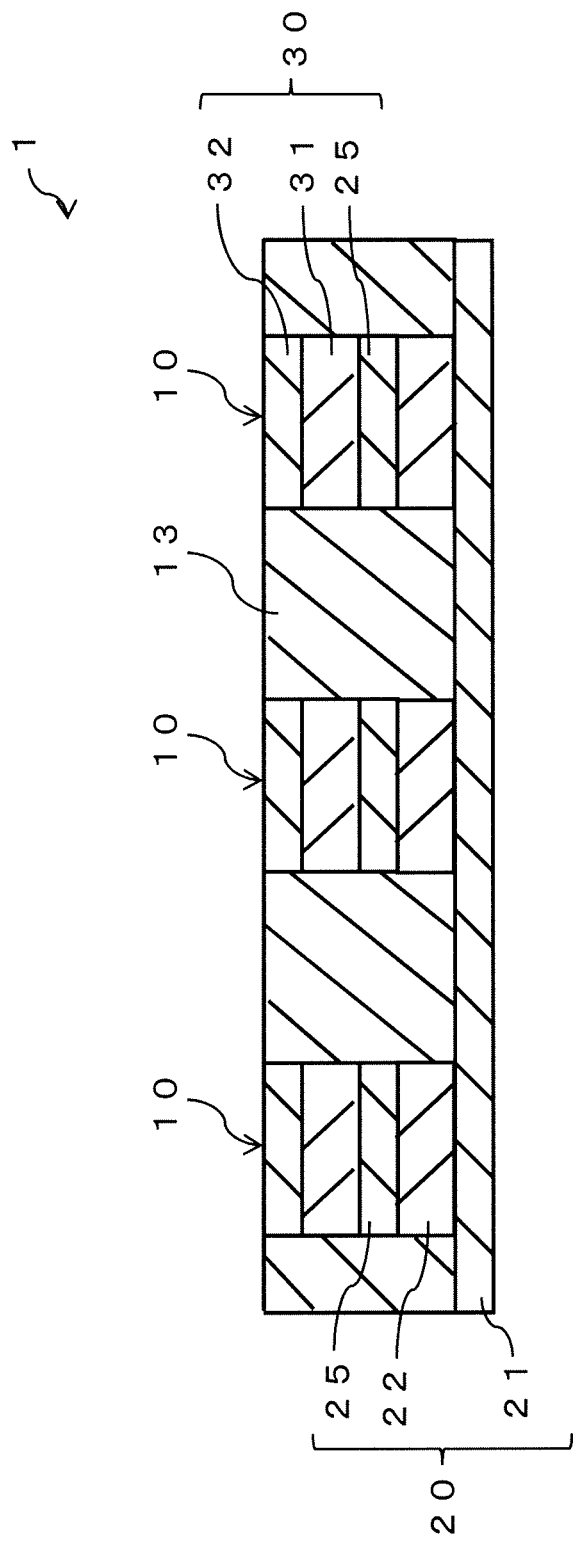
FIG. 23 is a diagram illustrating a modification of a cross-sectional configuration of a portion of the memory cell array of FIG. 1.

FIG. 23 illustrates a modification of the memory cell array 1 according to the above-described embodiment. In the present modification, the diffusion suppressing layers 14, 15, 24, and 25 are not provided, and the switch layer 22 is in direct contact with the interlayer insulating film 13 and other layers. In the present modification, the layers that are in direct contact with the switch layer 22 (for example, the first electrode 21, the intermediate electrode 23, and the interlayer insulating film 13) are each made of the material that suppresses the diffusion of oxygen into the switch layer 22. This makes it possible to allow the oxygen content of the switch device 20 to be 5% or less, and to suppress the increase of the threshold voltage variation of the switch device 20. Note that, in the present modification, it is preferable that a manufacturing process similar to the above-described manufacturing process of the samples 01 to 03 in Experiment 1 be performed upon forming the switch device 20. This makes it possible to allow the oxygen content of the switch device 20 to be 5% or less, and to suppress the increase of the threshold voltage variation of the switch device 20.

[Modification C]

In the above-described embodiment and modifications A and B, the word lines WL or the bit lines BL may extend in the stacking direction of the memory cell array 1. In this case, each of the word lines WL and each of the bit lines BL face each other in a stacking in-plan direction of the memory cell array 1, and the switch device 20 and the memory device 30 that are included in each of the memory cells 10 are thus coupled in series to each other in the stacking in-plane direction of the memory cell array 1.

Hereinbefore, although the technology has been described by referring to the embodiment and the modifications A to C, the technology is not limited to the above-described embodiment and modifications, and various modifications may be made. Note that the effects described in the present specification are purely illustrative. Effects achieved by the technology are not limited to the effects described in the present specification. The technology may have effects other than the effects described in the present specification.

In addition, for example, the technology may also have the following configurations.

(1)

A switch device including:

a first electrode;

a second electrode that faces the first electrode;

a switch layer that is provided between the first electrode and the second electrode, and includes one or more kinds of chalcogen elements selected from tellurium (Te), selenium (Se), and sulfur (S); and a diffusion suppressing layer that is in contact with at least a portion of a surface of the switch layer, and suppresses diffusion of oxygen into the switch layer.

(2)

The switch device according to (1), in which the switch layer is changed to a low-resistance state by an increase in an application voltage to a predetermined threshold voltage or higher, and is changed to a high-resistance state by a decrease in the application voltage to a voltage that is lower than the threshold voltage.

(3)

The switch device according to (1) or (2), in which the diffusion suppressing layer is provided at a position that is different from a region between the first electrode and the switch layer or a region between the second electrode and the switch layer, and includes one of an insulating nitride, an insulating carbide, and an insulating boride.

(4)

The switch device according to (3), in which the diffusion suppressing layer includes a single layer of one kind or stacked layers of two or more kinds selected from a silicon nitride (SiN), a tantalum nitride (TaN), a silicon carbide (SiC), a silicon carbonitride (SiCN), an aluminum nitride (AlN), a boron nitride (BN), and a boron carbonitride (BCN).

(5)

The switch device according to (1) or (2), in which the diffusion suppressing layer is provided between the first electrode and the switch layer or between the second electrode and the switch layer.

(6)

The switch device according to (5), in which the diffusion suppressing layer includes a single layer film of one kind, or an alloy layer film or a stacked layer film of two or more kinds, selected from titanium (Ti), a titanium nitride (TiN), tantalum (Ta), zirconium (Zr), a zirconium nitride (ZrN), hafnium (Hf), a hafnium nitride (HfN), a tantalum nitride (TaN), tungsten (W), a tungsten nitride (WN), platinum (Pt), gold (Au), ruthenium (Ru), and iridium (Ir).

(7)

The switch device according to (5), in which the diffusion suppressing layer is a silicon nitride (SiN) film having a thickness in a range from 0.1 nm to 5 nm.

(8)

The switch device according to any one of (1) to (7), in which the first electrode and the second electrode each include a metallic material that suppresses the diffusion of the oxygen into the switch layer.

(9)

The switch device according to (8), in which the first electrode and the second electrode each include a single layer film of one kind, or an alloy layer film or a stacked layer film of two or more kinds, selected from titanium (Ti), a titanium nitride (TiN), tantalum (Ta), zirconium (Zr), a zirconium nitride (ZrN), hafnium (Hf), a hafnium nitride (HfN), a tantalum oxide (TaN), tungsten (W), a tungsten nitride (WN), platinum (Pt), gold (Au), ruthenium (Ru), and iridium (Ir).

(10)

The switch device according to any one of (1) to (9), in which the switch layer further includes one or more kinds of elements selected from boron (B), aluminum (Al), gallium (Ga), carbon (C), silicon (Si), germanium (Ge), nitrogen (N), phosphorus (P), arsenic (As), antimony (Ab), and bismuth (Bi).

(11)

The switch device according to any one of (1) to (10), in which the switch layer further includes one or more kinds of elements selected from boron (B), carbon (C), silicon (Si), and nitrogen (N).

(12)

The switch device according to (11), in which the switch layer includes any one of compositions of BTe, CTe, BCTe, CSiTe, BSiTe, BCSiTe, BTeN, CTeN, BCTeN, CSiTeN, BSiTeN, and BCSiTeN.

(13)

The switch device according to any one of (1) to (12), in which the switch layer has an oxygen content that is equal to or less than 5%.

(14)

The switch device according to any one of (1) to (13), in which the switch layer is in contact with only a non-oxide layer.

(15)

A switch device including:
a first electrode;
a second electrode that faces the first electrode; and
a switch layer that is provided between the first electrode and the second electrode, and includes one or more kinds of chalcogen elements selected from tellurium (Te), selenium (Se), and sulfur (S), the switch layer having an oxygen content that is 5% or less.

(16)

A storage unit provided with a plurality of memory cells, the memory cells each including a memory device and a switch device directly coupled to the memory device, the switch device including:
a first electrode;
a second electrode that faces the first electrode;
a switch layer that is provided between the first electrode and the second electrode, and includes one or more kinds of chalcogen elements selected from tellurium (Te), selenium (Se), and sulfur (S); and
a diffusion suppressing layer that is in contact with at least a portion of a surface of the switch layer, and suppresses diffusion of oxygen into the switch layer.

(17)

A storage unit provided with a plurality of memory cells, the memory cells each including a memory device and a switch device directly coupled to the memory device, the switch device including:
a first electrode;
a second electrode that faces the first electrode; and
a switch layer that is provided between the first electrode and the second electrode, and includes one or more kinds of chalcogen elements selected from tellurium (Te), selenium (Se), and sulfur (S), the switch layer having an oxygen content that is 5% or less.

The present application is based on and claims priority from Japanese Patent Application No. 2015-073054 filed with the Japan Patent Office on Mar. 31, 2015, the entire contents of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A switch device comprising:
a first electrode;
a second electrode that faces the first electrode;
a switch layer that is provided between the first electrode and the second electrode, and includes one or more kinds of chalcogen elements selected from tellurium (Te), selenium (Se), and sulfur (S); and
a diffusion suppressing layer that is in contact with at least a portion of a surface of the switch layer, and suppresses diffusion of oxygen into the switch layer.

2. The switch device according to claim 1, wherein the switch layer is changed to a low-resistance state by an increase in an application voltage to a predetermined threshold voltage or higher, and is changed to a high-resistance state by a decrease in the application voltage to a voltage that is lower than the threshold voltage.

3. The switch device according to claim 1, wherein the diffusion suppressing layer is provided at a position that is different from a region between the first electrode and the switch layer or a region between the second electrode and the switch layer, and includes one of an insulating nitride, an insulating carbide, and an insulating boride.

4. The switch device according to claim 3, wherein the diffusion suppressing layer includes a single layer of one kind or stacked layers of two or more kinds selected from a silicon nitride (SiN), a tantalum nitride (TaN), a silicon carbide (SiC), a silicon carbonitride (SiCN), an aluminum nitride (AlN), a boron nitride (BN), and a boron carbonitride (BCN).

5. The switch device according to claim 1, wherein the diffusion suppressing layer is provided between the first electrode and the switch layer or between the second electrode and the switch layer.

6. The switch device according to claim 5, wherein the diffusion suppressing layer includes a single layer film of one kind, or an alloy layer film or a stacked layer film of two or more kinds, selected from titanium (Ti), a titanium nitride (TiN), tantalum (Ta), zirconium (Zr), a zirconium nitride (ZrN), hafnium (Hf), a hafnium nitride (HfN), a tantalum nitride (TaN), tungsten (W), a tungsten nitride (WN), platinum (Pt), gold (Au), ruthenium (Ru), and iridium (Ir).

7. The switch device according to claim 5, wherein the diffusion suppressing layer is a silicon nitride (SiN) film having a thickness in a range from 0.1 nm to 5 nm.

8. The switch device according to claim 1, wherein the first electrode and the second electrode each include a metallic material that suppresses the diffusion of the oxygen into the switch layer.

9. The switch device according to claim 8, wherein the first electrode and the second electrode each include a single layer film of one kind, or an alloy layer film or a stacked layer film of two or more kinds, selected from titanium (Ti), a titanium nitride (TiN), tantalum (Ta), zirconium (Zr), a zirconium nitride (ZrN), hafnium (Hf), a hafnium nitride (HfN), a tantalum oxide (TaN), tungsten (W), a tungsten nitride (WN), platinum (Pt), gold (Au), ruthenium (Ru), and iridium (Ir).

10. The switch device according to claim 1, wherein the switch layer further includes one or more kinds of elements selected from boron (B), aluminum (Al), gallium (Ga), carbon (C), silicon (Si), germanium (Ge), nitrogen (N), phosphorus (P), arsenic (As), antimony (Ab), and bismuth (Bi).

11. The switch device according to claim 1, wherein the switch layer further includes one or more kinds of elements selected from boron (B), carbon (C), silicon (Si), and nitrogen (N).

12. The switch device according to claim 11, wherein the switch layer includes any one of compositions of BTe, CTe, BCTe, CSiTe, BSiTe, BCSiTe, BTeN, CTeN, BCTeN, CSiTeN, BSiTeN, and BCSiTeN.

13. The switch device according to claim 1, wherein the switch layer has an oxygen content that is equal to or less than 5%.

14. The switch device according to claim 1, wherein the switch layer is in contact with only a non-oxide layer.

15. A switch device comprising:
a first electrode;
a second electrode that faces the first electrode; and
a switch layer that is provided between the first electrode and the second electrode, and includes one or more kinds of chalcogen elements selected from tellurium (Te), selenium (Se), and sulfur (S), the switch layer having an oxygen content that is 5% or less.

16. A storage unit provided with a plurality of memory cells, the memory cells each including a memory device and a switch device directly coupled to the memory device, the switch device comprising:
a first electrode;
a second electrode that faces the first electrode;
a switch layer that is provided between the first electrode and the second electrode, and includes one or more kinds of chalcogen elements selected from tellurium (Te), selenium (Se), and sulfur (S); and
a diffusion suppressing layer that is in contact with at least a portion of a surface of the switch layer, and suppresses diffusion of oxygen into the switch layer.

17. A storage unit provided with a plurality of memory cells, the memory cells each including a memory device and a switch device directly coupled to the memory device, the switch device comprising:
a first electrode;
a second electrode that faces the first electrode; and
a switch layer that is provided between the first electrode and the second electrode, and includes one or more kinds of chalcogen elements selected from tellurium (Te), selenium (Se), and sulfur (S), the switch layer having an oxygen content that is 5% or less.

* * * * *